US011361794B2

(12) United States Patent
Damaghi et al.

(10) Patent No.: US 11,361,794 B2
(45) Date of Patent: Jun. 14, 2022

(54) APPARATUS AND METHOD FOR STORING WAVE SIGNALS IN A CAVITY

(71) Applicant: LyteLoop Technologies, LLC, Great Neck, NY (US)

(72) Inventors: Daniel Damaghi, Great Neck, NY (US); Ohad Harlev, Closter, NJ (US); Armand Vedadi-Comte, New York, NY (US); Paul Francis McManamon, Dayton, OH (US); Alan Eli Willner, Los Angeles, CA (US)

(73) Assignee: LYTELOOP TECHNOLOGIES, LLC, Great Neck, NY (US)

( * ) Notice: Subject to any disclaimer, the term of this patent is extended or adjusted under 35 U.S.C. 154(b) by 64 days.

(21) Appl. No.: 16/529,479

(22) Filed: Aug. 1, 2019

(65) Prior Publication Data

US 2020/0043522 A1 Feb. 6, 2020

Related U.S. Application Data

(60) Provisional application No. 62/713,735, filed on Aug. 2, 2018.

(51) Int. Cl.
*H04B 10/00* (2013.01)
*G11B 7/0045* (2006.01)

(52) U.S. Cl.
CPC ................. *G11B 7/0045* (2013.01)

(58) Field of Classification Search
CPC ............. H04B 10/112; H04B 10/1123; H04B 10/1125; H04B 10/1129; H04B 10/1127;
(Continued)

(56) References Cited

U.S. PATENT DOCUMENTS 3,141,153 A 7/1964 Klein
3,164,809 A 1/1965 Pearce et al.
(Continued)

FOREIGN PATENT DOCUMENTS

CA 2266132 A1 9/2000
EP 0080841 A2 11/1982
(Continued)

OTHER PUBLICATIONS

KIPO Notice of Preliminary Rejection (with English Translation), dated Jul. 21, 2020, in S. Korean Patent Application No. 10-2019-7005794 (10 pages).
(Continued)

*Primary Examiner* — Hanh Phan
(74) *Attorney, Agent, or Firm* — Amster, Rothstein & Ebenstein LLP

(57) ABSTRACT

An apparatus comprising a cavity having interior surfaces or reflecting elements, one or more transmitters configured to receive an electrical signal, transform the electrical signal into an electromagnetic wave signal, and introduce the electromagnetic wave signal into an inside of the cavity, and one or more receivers configured to retrieve the electromagnetic wave signal, transform the electromagnetic wave signal to a corresponding electrical signal, and transmit the corresponding electrical signal to the outside of the cavity is disclosed. The electromagnetic wave signal is contained within the inside of the cavity until retrieved by undergoing a series of reflections or traversals between the interior surfaces of the cavity or the reflecting elements within the cavity. The apparatus may further comprise one or more regenerators configured to re-amplify, re-shape, and/or re-time the electromagnetic wave signal traveling within the inside of the cavity.

50 Claims, 15 Drawing Sheets

(58) Field of Classification Search
CPC .............. H04B 10/114; H04B 10/1143; H04B 10/1149; H04B 10/116; H04B 10/40
USPC ........ 398/118, 119, 127, 124, 125, 126, 128, 398/129, 130, 131, 115, 183, 188, 202, 398/208, 135, 136
See application file for complete search history.

(56) References Cited

U.S. PATENT DOCUMENTS

| | | |
|---|---|---|
| 3,229,258 A | 1/1966 | Heibeck et al. |
| 3,277,450 A | 10/1966 | Edson |
| 3,350,697 A | 10/1967 | Hirvela |
| 3,411,142 A | 11/1968 | Lee et al. |
| 4,014,166 A | 3/1977 | Cateora et al. |
| 4,136,929 A | 1/1979 | Suzaki |
| 4,166,212 A | 8/1979 | Judeinstein |
| 4,180,814 A | 12/1979 | Barton |
| 4,359,733 A | 11/1982 | O'Neill |
| 4,455,651 A | 6/1984 | Baran |
| 4,469,397 A | 9/1984 | Shaw et al. |
| 4,473,270 A | 9/1984 | Shaw |
| 4,479,701 A | 10/1984 | Newton et al. |
| 4,586,779 A | 5/1986 | Huignard et al. |
| 4,588,255 A | 5/1986 | Tur et al. |
| 4,652,079 A | 3/1987 | Shaw et al. |
| 4,653,042 A | 3/1987 | d'Auria et al. |
| 4,656,666 A | 4/1987 | Piekenbrock |
| 4,708,421 A | 11/1987 | Desurvire et al. |
| 4,738,503 A | 4/1988 | Desurvire et al. |
| 4,744,083 A | 5/1988 | O'Neill et al. |
| 4,815,804 A | 3/1989 | Desurvire et al. |
| 4,856,862 A | 8/1989 | Passmore et al. |
| 4,877,952 A | 10/1989 | Halemane |
| 4,896,948 A | 1/1990 | Dono et al. |
| 4,923,267 A | 5/1990 | Su |
| 4,974,931 A | 12/1990 | Poole |
| 5,058,060 A | 10/1991 | Su |
| 5,144,322 A | 9/1992 | Gabriel |
| 5,319,482 A | 6/1994 | Tsuchiya et al. |
| 5,335,098 A | 8/1994 | Leyva et al. |
| 5,392,154 A | 2/1995 | Chang et al. |
| 5,438,337 A | 8/1995 | Aguado |
| 5,440,669 A | 8/1995 | Rakuljic et al. |
| 5,533,154 A | 7/1996 | Smith |
| 5,555,127 A | 9/1996 | Abdelkader et al. |
| 5,566,261 A | 10/1996 | Hall et al. |
| 5,602,838 A | 2/1997 | Kartalopoulos |
| 5,740,117 A | 4/1998 | Bona et al. |
| 5,844,700 A | 12/1998 | Jeganathan et al. |
| 5,862,286 A | 1/1999 | Imanishi et al. |
| 5,896,213 A | 4/1999 | Nagahori et al. |
| 5,978,130 A | 11/1999 | Fee et al. |
| 5,991,069 A | 11/1999 | Jander |
| 6,002,916 A | 12/1999 | Lynch |
| 6,035,081 A | 3/2000 | Poustie et al. |
| 6,043,918 A | 3/2000 | Bozzay et al. |
| 6,144,486 A | 11/2000 | Bennett et al. |
| 6,172,926 B1 | 1/2001 | Drayer |
| 6,275,479 B1 | 8/2001 | Snell et al. |
| 6,301,037 B1 | 10/2001 | Fischer et al. |
| 6,304,354 B2 | 10/2001 | Carlson |
| 6,317,095 B1 | 11/2001 | Teshirogi et al. |
| 6,317,232 B1 | 11/2001 | Fee et al. |
| 6,347,099 B1 | 2/2002 | da Silva et al. |
| 6,366,356 B1 | 4/2002 | Brosnan et al. |
| 6,437,890 B1 | 8/2002 | Scheps |
| 6,452,719 B2 | 9/2002 | Kinoshita |
| 6,535,314 B1 | 3/2003 | Mendenhall et al. |
| 6,580,552 B2 | 6/2003 | Welch |
| 6,609,840 B2 | 8/2003 | Chow et al. |
| 6,647,163 B2 | 11/2003 | Song |
| 6,674,754 B1 | 1/2004 | Ofek |
| 6,819,817 B2 | 11/2004 | Kaneko |
| 6,826,335 B1 | 11/2004 | Grudinin et al. |
| 6,829,439 B1 * | 12/2004 | Sidorovich .......... H04B 10/114 398/131 |
| 6,839,520 B1 | 1/2005 | Dresicher et al. |
| 6,850,364 B2 | 2/2005 | Xie et al. |
| 6,912,075 B1 | 6/2005 | Ionov et al. |
| 6,917,739 B2 | 7/2005 | Chen |
| 6,930,825 B2 | 8/2005 | Nagel et al. |
| 6,973,271 B2 | 12/2005 | Farmer et al. |
| 7,103,239 B2 | 9/2006 | Kish, Jr. et al. |
| 7,103,280 B1 | 9/2006 | Ionov et al. |
| 7,110,651 B2 | 9/2006 | Golowich et al. |
| 7,149,431 B2 | 12/2006 | Jung et al. |
| 7,167,286 B2 | 1/2007 | Anderson et al. |
| 7,174,067 B2 | 2/2007 | Murshid et al. |
| 7,177,510 B2 | 2/2007 | Ramachandran |
| 7,180,447 B1 | 2/2007 | Jacomb-Hood |
| 7,199,343 B2 | 4/2007 | Mosley |
| 7,235,150 B2 | 6/2007 | Bischel et al. |
| 7,369,085 B1 | 5/2008 | Jacomb-Hood |
| 7,450,618 B2 | 11/2008 | Dantus et al. |
| 7,542,679 B2 | 6/2009 | Price |
| 7,557,365 B2 | 7/2009 | Gorrell et al. |
| 7,729,398 B2 | 6/2010 | Livingston |
| 7,733,930 B2 | 6/2010 | Livingston |
| 7,742,209 B2 | 6/2010 | Curtis et al. |
| 7,742,210 B2 | 6/2010 | Raguin et al. |
| 7,756,169 B2 | 7/2010 | Livingston et al. |
| 7,796,487 B2 | 9/2010 | Chu et al. |
| 7,843,791 B2 | 11/2010 | Kwon et al. |
| 7,950,812 B2 * | 5/2011 | Roes ..................... G02B 26/02 359/529 |
| 8,036,537 B2 | 10/2011 | Cai |
| 8,232,028 B2 | 7/2012 | Askham |
| 8,305,863 B2 | 11/2012 | Tatsuta et al. |
| 8,417,125 B2 | 4/2013 | Chand et al. |
| 8,532,486 B2 | 9/2013 | Stead et al. |
| 8,582,972 B2 | 11/2013 | Small et al. |
| 8,699,888 B2 | 4/2014 | Scaffardi et al. |
| 8,913,894 B2 | 12/2014 | Coleman et al. |
| 9,077,577 B1 | 7/2015 | Ashrafi et al. |
| 9,176,280 B2 | 11/2015 | Li et al. |
| 9,503,186 B2 | 11/2016 | Kawanishi et al. |
| 9,570,811 B2 | 2/2017 | Ohshima et al. |
| 9,609,402 B2 | 3/2017 | Long et al. |
| 9,625,878 B2 | 4/2017 | Fontecchio et al. |
| 9,712,239 B2 | 7/2017 | Murshid et al. |
| 9,749,080 B2 | 8/2017 | Shi et al. |
| 9,760,061 B2 | 9/2017 | Ayres et al. |
| 9,812,845 B1 | 11/2017 | Lee et al. |
| 9,843,388 B1 | 12/2017 | Lam et al. |
| 9,912,409 B2 | 3/2018 | Jia et al. |
| 9,917,646 B2 | 3/2018 | Turgeon et al. |
| 10,001,603 B2 | 6/2018 | Martinelli |
| 10,073,417 B2 | 9/2018 | Ashrafi et al. |
| 10,084,532 B2 | 9/2018 | Buer et al. |
| 10,103,799 B2 | 10/2018 | Luddy et al. |
| 10,122,456 B2 | 11/2018 | Hreha |
| 10,142,012 B2 | 11/2018 | Welle |
| 10,305,560 B2 | 5/2019 | Adachi et al. |
| 10,312,999 B2 | 6/2019 | Neuman |
| 10,326,526 B2 | 6/2019 | Ashrafi |
| 10,411,811 B2 | 9/2019 | Willner et al. |
| 10,606,146 B2 | 3/2020 | Heine |
| 10,827,911 B2 | 11/2020 | Ramachandran et al. |
| 2001/0012142 A1 | 8/2001 | Carlson |
| 2002/0075536 A1 | 6/2002 | Cao |
| 2002/0181342 A1 | 12/2002 | Clark |
| 2002/0196488 A1 | 12/2002 | Myers |
| 2003/0007230 A1 | 1/2003 | Kaneko et al. |
| 2003/0128365 A1 | 7/2003 | Strandjord et al. |
| 2003/0219258 A1 | 11/2003 | Ellis et al. |
| 2004/0151428 A1 | 8/2004 | Nikonov |
| 2004/0190845 A1 | 9/2004 | Chen |
| 2004/0246583 A1 | 12/2004 | Mueller et al. |
| 2005/0084801 A1 | 4/2005 | Ei-Hafidi et al. |
| 2006/0173983 A1 | 8/2006 | Naito et al. |
| 2007/0072546 A1 | 3/2007 | Jenkin et al. |
| 2007/0081785 A1 | 4/2007 | Hays |
| 2007/0098052 A1 | 5/2007 | Budic |

(56) References Cited

U.S. PATENT DOCUMENTS

| | | | |
|---|---|---|---|
| 2008/0002981 A1 | 1/2008 | Valley et al. | |
| 2008/0008076 A1 | 6/2008 | Raguin et al. | |
| 2008/0144164 A1 | 6/2008 | Metivier | |
| 2008/0151735 A1 | 6/2008 | Seo et al. | |
| 2008/0239428 A1 | 10/2008 | Bell et al. | |
| 2009/0185175 A1* | 7/2009 | Cole | G01J 3/42 356/213 |
| 2009/0202191 A1 | 8/2009 | Ramachandran | |
| 2009/0219959 A1 | 9/2009 | Murison et al. | |
| 2010/0269143 A1 | 10/2010 | Rabowsky | |
| 2010/0279604 A1 | 11/2010 | Wood | |
| 2010/0322058 A1 | 12/2010 | Hutt et al. | |
| 2012/0063752 A1 | 3/2012 | Cochran | |
| 2012/0188865 A1 | 7/2012 | Michaelis et al. | |
| 2013/0120831 A1 | 5/2013 | McClean et al. | |
| 2013/0175450 A1 | 7/2013 | Scherer et al. | |
| 2013/0216180 A1 | 8/2013 | Tan et al. | |
| 2013/0315590 A1 | 11/2013 | Zhou | |
| 2014/0334284 A1 | 11/2014 | Byun et al. | |
| 2015/0104141 A1 | 4/2015 | Logunov et al. | |
| 2015/0244458 A1 | 8/2015 | Erkmen et al. | |
| 2015/0288542 A1 | 10/2015 | Ashrafi et al. | |
| 2016/0043794 A1 | 2/2016 | Ashrafi et al. | |
| 2016/0204866 A1 | 7/2016 | Boronson et al. | |
| 2016/0204896 A1 | 7/2016 | Yu et al. | |
| 2017/0034250 A1 | 2/2017 | Sobhani et al. | |
| 2017/0139079 A1 | 5/2017 | Alfano et al. | |
| 2017/0280211 A1* | 9/2017 | Damaghi | H04J 14/005 |
| 2017/0302048 A1 | 10/2017 | Li et al. | |
| 2018/0131447 A1 | 5/2018 | Soares et al. | |
| 2019/0074893 A1 | 3/2019 | Kaen et al. | |
| 2019/0334609 A1 | 10/2019 | Alavi et al. | |
| 2020/0050959 A1 | 2/2020 | Ashrafi | |
| 2020/0277087 A1 | 9/2020 | Kaen | |

FOREIGN PATENT DOCUMENTS

| | | |
|---|---|---|
| EP | 174540 A2 | 3/1986 |
| EP | 883322 B1 | 7/2000 |
| EP | 1462883 A2 | 9/2004 |
| JP | H5-72591 A1 | 3/1993 |
| JP | 2008117446 A | 5/2008 |
| JP | 2012084630 A | 4/2012 |
| JP | 2015531071 A | 10/2015 |
| RU | 2155447 C1 | 8/2000 |
| RU | 2459284 C2 | 3/2005 |
| WO | 9508778 A1 | 3/1995 |
| WO | 9844512 A1 | 10/1998 |
| WO | 2002/097467 A2 | 12/2002 |
| WO | 2004023192 A2 | 3/2004 |
| WO | 2006101873 A2 | 9/2006 |
| WO | 2011142849 A2 | 11/2011 |
| WO | 2014029971 A1 | 2/2014 |
| WO | 2014107696 A1 | 7/2014 |
| WO | 2016164038 A1 | 10/2016 |
| WO | 2017165429 A1 | 9/2017 |
| WO | 2020144319 A1 | 7/2020 |

OTHER PUBLICATIONS

U.S. Appl. No. 16/262,225, Office Action dated Jul. 21, 2020.
U.S. Appl. No. 16/536,358, Notice of Allowance dated May 26, 2020.
U.S. Appl. No. 16/672,221, Office Action dated Jun. 25, 2020.
Extended European Search Report and Search Opinion for EP Application No. 20 184 820.7, dated Oct. 29, 2020, (Search Report 4 pgs.; Opinion 1 pg.; totaling 5 pgs.).
Extended European Search Report and Search Opinion for EP Application No. 20 184 821.5, dated Nov. 4, 2020 (Search Report 5 pgs.; Opinion 6 pgs.; totaling 11 pgs.).
A. E. Willner, et al., Star Couplers With Gain Using Multiple Erbium-Doped Fibers Pumped With A Single Layer, IEEE Photonics Technology Letters, Mar. 1991, pp. 250-252, vol. 3, No. 3, IEEE Xplore Digital Library, United States.
A. Hasegawa, H. Toda, M. Shikata, Y. Ozeki, T. Suzaki, Y. Ueno, K. Tajima, Experimental demonstration of the compressed optical packet multiplexing scheme, Journal of Optical Networking, vol. 1, No. 7 (Jul. 2002), pp. 221-236, 42304250.
Anjali Agarwal, et al., All-Optical Loadable And Erasable Storage Buffer Based On Parametric Nonlinearity In Fiber, Journal of Lightwave Technology, Jul. 2005, pp. 2229-2238, vol. 23, Issue No. 7, United States.
Bernd Friedrichs et al., Error-Control Coding and Packet Processing for Broadband Relay Satellite Networks with Optical and Microwave Links, 2012 6th Advanced Satellite Multimedia Systems Conference (ASMS) and 12th Signal Processing for Space Communications Workshop (SPSC) (2012), pp. 101-110.
Bo E. Miller and Yuzuru Takashima, Cavity Techniques For Holographic Data Storage Recording, Optics Express, Mar. 14, 2016, vol. 24, Issue 6, pp. 6300-6317, Optical Society of America, United States.
E. V. Carrera, R. Bianchini, Disk caching with an optical ring, Appl. Opt. Dec. 2000 10:39 (35):666380 (Camrera 2000).
European Search Report and Written Opinion, dated Nov. 5, 2019 issued in corresponding European Application 17 770 999.5 (Search Report 4 pgs.; Opinion 3 pgs.; totaling 7 pgs.).
F. Della Valle, et al., Extremely Long Decay Time Optical Cavity, Optics Express, May 6, 2014, pp. 11570-11577, vol. 22, Issue 10, Optical Society of America, United States.
Federal Institute of Industrial Property, Search Report dated Apr. 1, 2019.
Federal Institute of Industrial Property, Search Report dated Jun. 4, 2019 (issued Jul. 29, 2019).
Francois Leo et al., Temporal cavity solitons in one-dimensional Kerr media as bits in all-optical buffer, Nature Photonics, 4:471-476, May 23, 2010.
G. S. McDonald et al., Spatial solitary-wave optical memory, Journal of the Optical Society of America B (Opted Physics) (J. Opt. Soc. Am.), 7(7):1328-1335, Jul. 1990.
G.D. Bartolini, D.K. Serkland, P. Kumar, W.L. Kath. (1997). All-optical storage of a picosecondpulse packet using parametric amplification. IEEE Photomcs Technology Letters, 9(7), 1020-1022 [Bartolini 1997].
Geoffrey W. Burr et al., Angle and Space Multiplexed Holographic Storage Using the 90° Geometry, Optics Communications, May 15, 1995, pp. 49-55, vol. 117, Issues 1-2, United States.
Geoffrey W. Burr et al., Volume Holographic Data Storage at an Areal Density of 250 Gigapixels/In./\2, Optics Letters, vol. 26, No. 7, Apr. 1, 2001, pp. 444-446, United States.
J .H. Reif, A. Tyagi. An Optical Delay Line Memory Model with Efficient Algorithms, Optical Engineering, 36(9), (1997).
J. Ashley et al., Holographic Data Storage, IBM Journal of Research and Development, vol. 44, Issue 3, May 2000, pp. 341-368, United States.
Keiji Kuroda and Yuzo Yoshikuni, Two-Wavelength Pump-Probe Technique Using Single Distributed Feedback Laser Array to Probe Gain Recovery of an Erbium-Doped Fiber Amplifier, Optical Fiber Technology, Mar. 2017, pp. 20-22, vol. 34, Elsevier, Inc.
Mansour I. Irshid and Moshen Kavehrad, Star Couplers With Gain Using Fiber Amplifiers, IEEE Photonics Technology Letters, Jan. 1992, pp. 58-60, vol. 4, No. 1, IEEE Xplore Digital Library, United States.
Obulapathi N. Challa et al., Distributed Data Storage on CubeSat Clusters, Advances in Computing, 3(3):36-49 (2013).
Paul F. McManamon et al., Laser Radar, Progress and Opportunities in Active Electro-Optical Sensing, National Research Council of the National Academies, 2014.
PCT International Search Report, dated Aug. 22, 2017 in International Application No. PCT/U52017/023431 (4 pages).
Robert W. Boyd et al., Applications of Slow Light in Telecommunications, Optics & Photonics News, 17(4):18-23, Apr. 2006.
S.L. Tsao, T.Y. Chen, Comparison of Two 1550 nm Ultra Narrow-Band Optical Infinite Impulse Response Filters for High-Speed Optical Signal Processing, Optical Storage and Optical Information Processing, Proceedings of SPIE, vol. 4081, 2000.

(56) References Cited

OTHER PUBLICATIONS

Shankar Pidishety et al., Investigation of scalability of all-fiber fused mode selective coupler for generating multiple OAM states, Proceedings of International Conference on Fiber Optics and Photonics, Jan. 2016.
Singapore Search Report and Written Opinion, dated Aug. 20, 2019 issued in Singapore Application No. 10201901665X.
Stephane Gagnon et al., Recent developments in satellite laser communications: Canadian context. Proc. International Conference on Space Optical Systems and Applications (ICSOS) (2012).
The International Bureau of WIPO, International Preliminary Report on Patentability for Intl. Appl. No. PCT/US2017/023431, dated Sep. 25, 2018, 7 pages, Geneva, Switzerland.
V.W.S. Chan, K. L. Hall, E. Modiano, K. A. Rauschenback. Architectures and Technologies for High-Speed Optical Data Networks, Journal of Lightwave Technology, vol. 16, Issue: 12, Dec. 1998.
Paul Marks, It's A Cloud, but Not As We Know It, ACM News, Communications of the ACM, Jul. 8, 2019, United States.
KIPO Notice of Preliminary Rejection (English Translation), dated Nov. 25, 2019, in S. Korean Patent Application No. 10-2018-7030269 (3 pages).
PCT International Search Report and Written Opinion in International Application No. PCT/US2019/044744 dated Oct. 29, 2019 (11 pages).
PCT International Search Report and Written Opinion in International Application No. PCT/US2019/045825 dated Nov. 1, 2019 (7 pages).
PCT International Search Report and Written Opinion in International Application No. PCT/US2019/059523 dated Jan. 22, 2020 (12 pages).
JPO Notice of Preliminary Rejection (English Translation), dated Jan. 14, 2020, in Japanese Patent Application No. 2018-550424 (4 pages).
JPO Notice of Preliminary Rejection (English Translation), dated Jan. 14, 2020, in Japanese Patent Application No. 2019-056078 (4 pages).
Federal Institute for Industrial Property, Search Report, dated Nov. 6, 2021, 4 pp. ( 2 pp. Search Report, 2 pp. translation), Moscow, Russia.
Federal Institute for Industrial Property, Official Action, Nov. 6, 2021, 10 pp. (6 pp. Official Action, 4 pp. translation), Moscow, Russia.
European Patent Office, Extended European Search Report in EPO Application No. 19848330.7, dated Aug. 6, 2021, 10 pp., Munich, Germany.
Extended European Search Report issued in Application No. 19843160.3, dated Apr. 20, 2022.

* cited by examiner

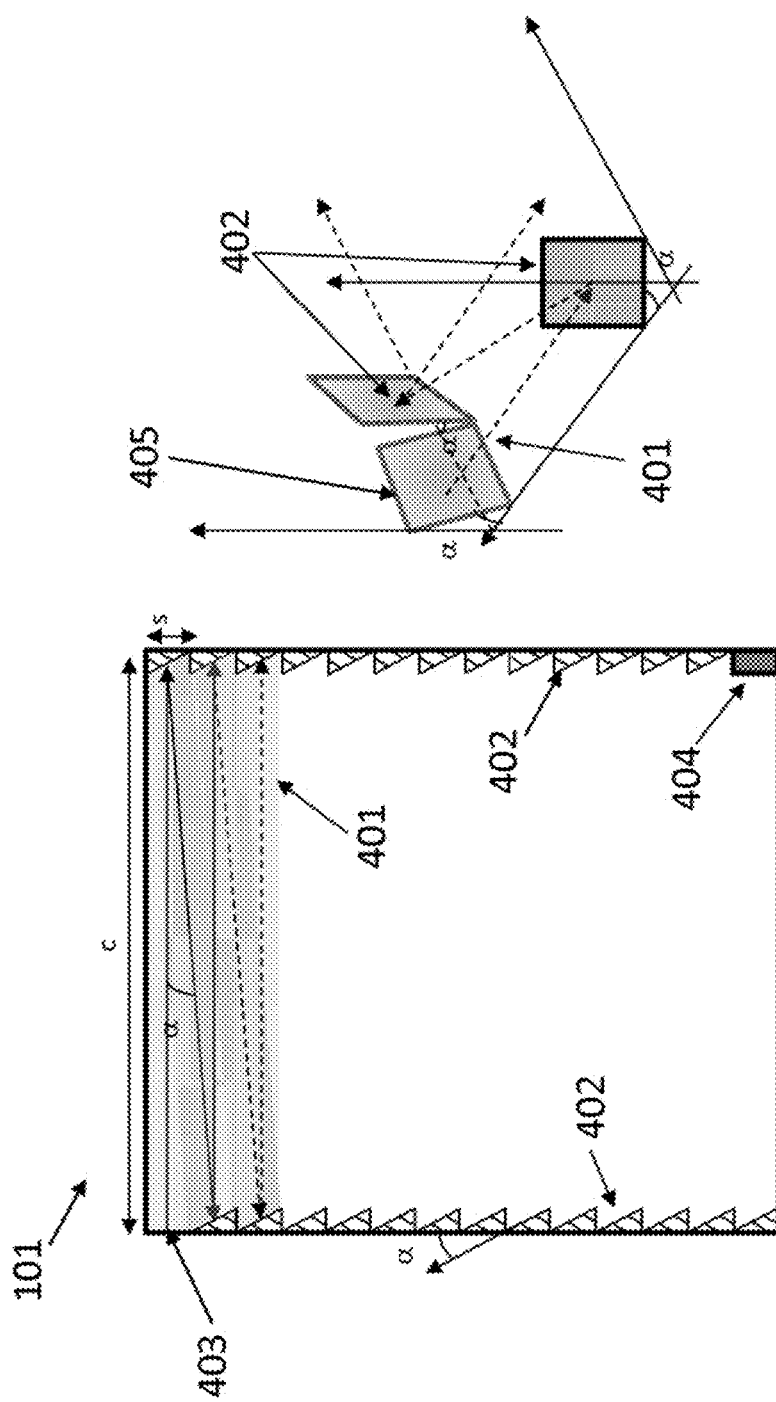

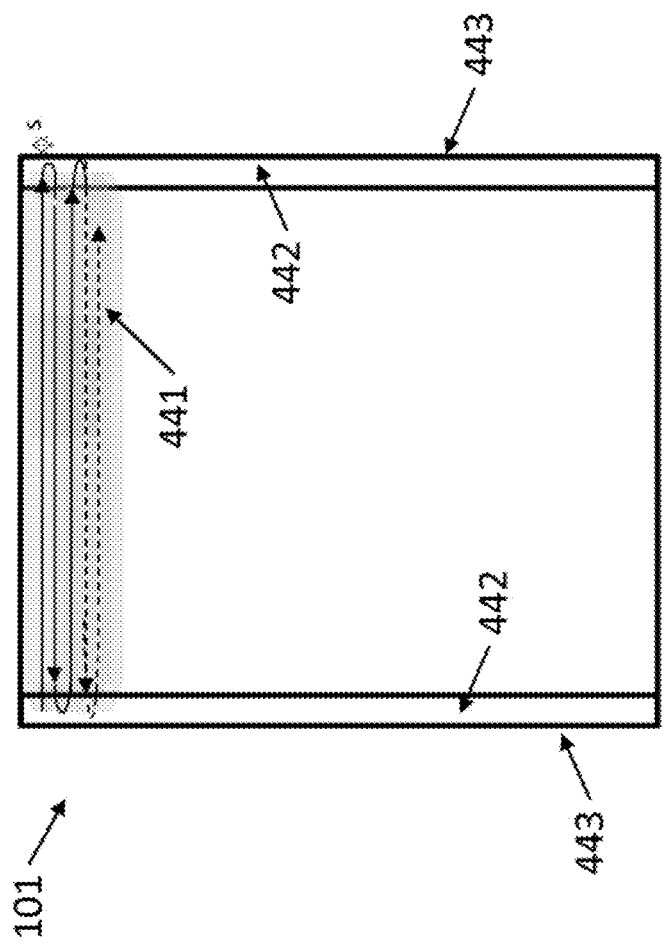

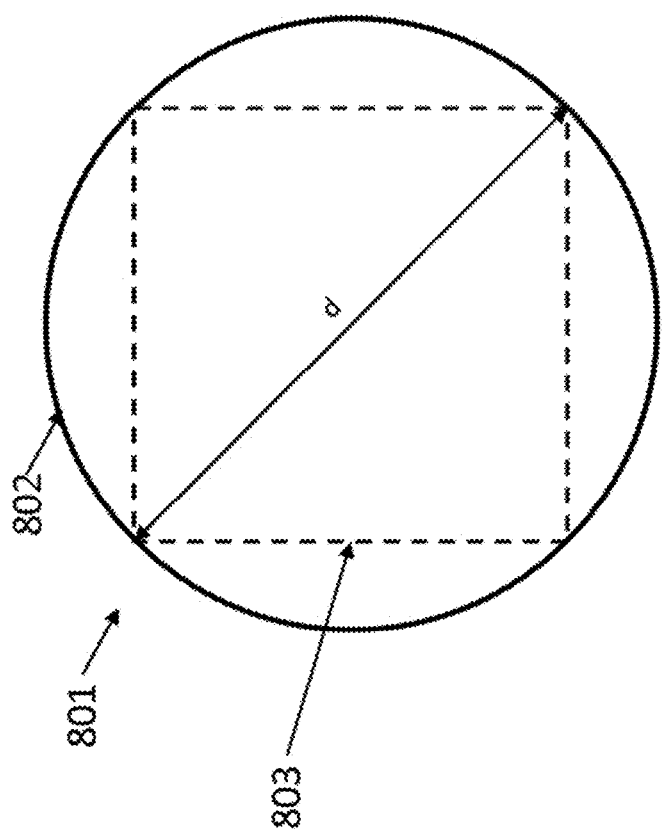

APPARATUS AND METHOD FOR STORING WAVE SIGNALS IN A CAVITY

CROSS-REFERENCE TO RELATED APPLICATIONS

The present non-provisional patent application claims the benefit of and priority to U.S. Provisional Patent Application No. 62/713,735, filed Aug. 2, 2018, the entire contents of which are incorporated herein by reference.

FIELD OF INVENTION

The present invention relates to the field of information storage technology and, in particular, to an apparatus and method for storing information as wave signals within cavities.

BACKGROUND OF THE INVENTION

The expansion of data centers, broadband communications and computationally intensive signal processing is driving the demand for high capacity data storage that consumes less power. Modern data centers also often require a rapid access to the same data stored on a same common drive to perform, for example, high performance computing (HPC). In addition, there is an increasing interest among many actors within the information technology (IT) storage industry (e.g., end customers, data centers, in-system programmers (ISP), in-circuit programmers (ICP), etc.) in being able to erase sensitive data (e.g., government data, military data) definitively and completely in an immediate manner.

Currently, solid state drives (SSDs), such as non-volatile NAND flash memory-based drives, and hard disk drives (HDDs) are examples of storage devices used to store data in data centers. Conventional data centers based on those solid state-based storage devices have a variety of drawbacks. For example, data storage using those conventional storage devices consumes a large amount of power and requires expensive maintenance. In addition, data storage involving many of those conventional storage devices generates a large amount of heat, necessitating cooling systems, which in turn require additional cost and energy consumption. Moreover, the throughput at which data can be read from or written to those conventional electromagnetic wave storage devices is limited by the speed of electronics to, for example, a few Gb/s. Additionally, when data is erased from a conventional non-volatile solid-state memory, an imprint of the erased data typically remains and with proper skills and technology, one could recover the erased data. Furthermore, to scale up the data center using those conventional storage devices, it is necessary to either buy more of the storage devices or replace the current storage devices with better-performing ones. Accordingly, constructing and upgrading data centers using the conventional storage devices is a costly and time-consuming process.

There is, therefore, a need for a data storage apparatus and method that overcomes one or more of the above and other deficiencies of data storage using the conventional storage devices.

SUMMARY OF THE INVENTION

It has now been found that the above and related objects of the present invention are obtained in the form of several related aspects, including an apparatus and method for storing wave signals, such as data in motion, in a cavity.

More particularly, the present invention relates to an apparatus comprising a cavity comprising interior surfaces or reflecting elements, one or more transmitters configured to receive an electrical signal, transform the electrical signal into an electromagnetic wave signal and introduce the electromagnetic wave signal into an inside of the cavity, and one or more receivers configured to retrieve the electromagnetic wave signal, transform the electromagnetic wave signal to a corresponding electrical signal and transmit the corresponding electrical signal to the outside of the cavity, wherein the electromagnetic wave signal is contained within the inside of the cavity by undergoing a series of reflections or traversals between the interior surfaces or the reflecting elements of or within the cavity.

In at least one embodiment, the apparatus further comprises one or more regenerators configured to re-amplify, re-shape, and/or re-time the electromagnetic wave signal traveling within the inside of the cavity. In at least one embodiment, the regenerators may include an all-optical regenerator or an optoelectronic regenerator.

In at least one embodiment, the inside of the cavity is configured to enable an atmospheric pressure level that is different than the atmospheric pressure level at the outside of the cavity. In at least one embodiment, the inside of the cavity is configured to enable an atmospheric pressure level that is lower than the atmospheric pressure level at the outside of the cavity.

In at least one embodiment, the apparatus further comprises a vacuum pump configured to maintain the inside of the cavity substantially under a vacuum condition.

In at least one embodiment, the electromagnetic wave signal comprises a modulated laser beam.

In at least one embodiment, the electromagnetic wave signal comprises any beam shape. In at least one embodiment, the electromagnetic wave signal comprises a Gaussian beam. In at least one embodiment, the electromagnetic wave signal comprises a non-Gaussian beam.

In at least one embodiment, the electromagnetic wave signal comprises a spatial mode. In at least one embodiment, the electromagnetic wave signal comprises an orbital angular momentum (OAM) mode.

In at least one embodiment, the cavity is substantially sealed.

In at least one embodiment, the cavity comprises a cubic cavity, a rectangular-shaped cavity, a tube cavity, a torus-shaped cavity, a spherical cavity, a polyhedron cavity, a parallelogram-shaped cavity, prism-shaped cavity, or an egg-shaped cavity.

In at least one embodiment, the cavity comprises a resonating cavity configured to create resonance at one or more frequencies of the electromagnetic wave signal.

In at least one embodiment, the one or more transmitters comprise at least one laser and at least one modulator.

In at least one embodiment, the one or more transmitters comprise at least one directly modulated laser.

In at least one embodiment, the one or more receivers comprise at least one photodetector.

In at least one embodiment, at least one of the one or more transmitters and at least one of the one or more receivers are placed together in a transceiver.

In at least one embodiment, the interior surfaces of the cavity are made at least in part of mirrors, reflecting coatings, gratings, or photonic microstructure materials configured to reflect or regenerate or separate or process the incident electromagnetic wave signal.

In at least one embodiment, the one or more regenerators comprise crystals or optical fibers.

In at least one embodiment, the crystals or the optical fibers are doped. In at least one embodiment, the crystals or the optical fibers are doped by fluorescent elements.

In at least one embodiment, the one or more regenerators comprise at least one amplifier and at least one absorber.

In at least one embodiment, the one or more regenerators comprise at least one amplifier configured to operate in a saturation regime.

In at least one embodiment, the one or more regenerators comprise a nonlinear filter.

In at least one embodiment, the one or more regenerators comprise an all-optical regenerator or an optoelectronic regenerator.

In at least one embodiment, the apparatus further comprises at least one of lenses, gratings, metamaterials, and optical materials configured to refocus or reshape the electromagnetic wave signal traveling within the inside of the cavity.

In at least one embodiment, the reflecting elements comprise a plurality of first parallel plates positioned within the inside of the cavity, wherein at least a portion of each side of each one of the first parallel plates comprises a reflective surface or a surface with a reflective element disposed thereon. In at least one embodiment, the first parallel plates are positioned substantially equidistant from each other.

In at least one embodiment, the reflecting elements further comprise a plurality of second parallel plates positioned perpendicular to the first parallel plates and a plurality of third parallel plates positioned perpendicular to the first and second parallel plates such that the first, second and third parallel plates define a plurality of sub-cavities within the inside of the cavity, wherein at least a portion of each side of each one of the second and third parallel plates comprises a reflective surface or a surface with a reflective element disposed thereon and the electromagnetic wave signal is contained within an inside of at least one of the sub-cavities until retrieved. In at least one embodiment, the second parallel plates are positioned substantially equidistant from each other. In at least one embodiment, the third parallel plates are positioned substantially equidistant from each other.

In at least one embodiment, the apparatus further comprises a signal focusing device placed on, or adjacent to, one or more of the interior surfaces or reflecting elements of the cavity and configured to separate two adjacent overlapping electromagnetic wave beams and focus them to separate points on the reflective interior surfaces or reflecting elements.

In at least one embodiment, the signal focusing device comprises a gradient index material, a photonic crystal structure, a mirror structure, or a diffraction structure.

In at least one embodiment, the cavity comprises a cubic cavity, and portions of the interior surfaces for two opposing faces of the cubic cavity comprise mirrors configured to reflect the incident electromagnetic wave signal such that the electromagnetic wave signal travels in a zig-zag manner within a first plane substantially perpendicular to the two opposing faces of the cubic cavity.

In at least one embodiment, each of the mirrors is configured to reflect the incident electromagnetic wave signal by an angle $\alpha=\sin^{-1}(s/\sqrt{(c^2+s^2)})$, wherein c is a side length of the cubic cavity and s is a transversal spot size of the electromagnetic wave signal.

In at least one embodiment, the apparatus further comprises a signal directing element configured to direct the electromagnetic wave signal to travel within a second plane, which is substantially parallel and adjacent to the first plane.

In at least one embodiment, the apparatus further comprises a signal directing element configured to direct the electromagnetic wave signal to travel within a second plane, which is substantially perpendicular to the first plane.

In addition, the present invention also relates to a method using an electromagnetic wave storage device comprising a cavity having interior surfaces or reflecting elements, one or more transmitters and one or more receivers, the method comprising the steps of receiving, by the one or more transmitters, an electrical signal, transforming, by the one or more transmitters, the received electrical signal into an electromagnetic wave signal, introducing, by the one or more transmitters, the electromagnetic wave signal into an inside of the cavity, wherein the electromagnetic wave signal is contained within the inside of the cavity by undergoing a series of reflections or traversals between the interior surfaces or the reflecting elements of the cavity, retrieving, by the one or more receivers, the electromagnetic wave signal, transforming, by the one or more receivers, the retrieved electromagnetic wave signal to a corresponding electrical signal, and transmitting, from the one or more receivers, the corresponding electrical signal to the outside of the cavity.

In at least one embodiment, the electromagnetic wave storage device further comprises one or more regenerators, and the method further comprises re-amplifying, re-shaping, and/or re-timing, by the one or more regenerators, the electromagnetic wave signal traveling within the inside of the cavity.

In at least one embodiment, the method further comprises enabling an atmospheric pressure level at the inside of the cavity to be different than an atmospheric pressure level at the outside of the cavity. In at least one embodiment, the method further comprises lowering an atmospheric pressure level at the inside of the cavity below to be below an atmospheric pressure level at the outside of the cavity.

In at least one embodiment, the method further comprises maintaining the inside of the cavity substantially under a vacuum condition.

In at least one embodiment, the step of transforming, by the one or more transmitters, the received data into an electromagnetic wave signal comprises transforming, by the one or more transmitters, the received data into a modulated laser beam.

In at least one embodiment, the step of transforming, by the one or more transmitters, the received data into an electromagnetic wave signal comprises transforming, by the one or more transmitters, the received data into a Gaussian beam, a non-Gaussian beam, or any other beam shape.

In at least one embodiment, the step of transforming, by the one or more transmitters, the received data into an electromagnetic wave signal comprises transforming, by the one or more transmitters, the received data into a spatial mode. In at least one embodiment, the step of transforming, by the one or more transmitters, the received data into an electromagnetic wave signal comprises transforming, by the one or more transmitters, the received data into an orbital angular momentum (OAM) mode.

In at least one embodiment, the method further comprises refocusing or reshaping, by using at least one of lenses, gratings, optical materials, and metamaterials, the electromagnetic wave signal traveling within the inside of the cavity.

In at least one embodiment, the electromagnetic wave storage device further comprises a signal focusing device, which is placed on, or adjacent to, one or more of the interior surfaces or reflecting elements of the cavity and configured to separate two adjacent overlapping electromagnetic wave beams and focus them to separate points on the reflective interior surfaces or reflecting elements, and the method further comprises the steps of focusing, by using the signal focusing device, the incident electromagnetic wave signal, and redirecting, by using the signal focusing device, the electromagnetic wave signal to an opposite direction.

In at least one embodiment, the signal focusing device comprises a gradient index material, a photonic crystal structure, a mirror structure, or a diffraction structure.

In at least one embodiment, the cavity comprises a cubic cavity and portions of the interior surfaces for two opposing faces of the cubic cavity comprise mirrors, and the method further comprises reflecting, by the mirrors, the incident electromagnetic wave signal such that the electromagnetic wave signal travels in a zig-zag manner within a first plane substantially perpendicular to the two opposing faces of the cubic cavity.

In at least one embodiment, the step of reflecting, by the mirrors, the incident electromagnetic wave signal comprises reflecting, by each of the mirrors, the incident electromagnetic wave signal by an angle $\alpha = \sin^{-1}(s/\sqrt{(c^2+s^2)})$, wherein c is a side length of the cubic cavity and s is a transversal spot size of the electromagnetic wave signal.

In at least one embodiment, the electromagnetic wave storage device further comprises a signal directing element, and the method further comprises directing, by the signal directing element, the electromagnetic wave signal to travel within a second plane, which is substantially parallel and adjacent to the first plane.

In at least one embodiment, the electromagnetic wave storage device further comprises a signal directing element, and the method further comprises directing, by the signal directing element, the electromagnetic wave signal to travel within a second plane, which is substantially perpendicular to the first plane.

In at least one embodiment, the one or more regenerators comprise an all-optical regenerator and the step of re-amplifying, re-shaping, and/or re-timing the electromagnetic wave signal is performed by the all-optical regenerator in an optical domain.

In at least one embodiment, the one or more regenerators comprise an optoelectronic regenerator, and the step of re-amplifying, re-shaping, and/or re-timing the electromagnetic wave signal comprises the steps of converting, by the optoelectronic regenerator, the electromagnetic wave signal to a corresponding electrical signal, re-amplifying, re-shaping, and/or re-timing, by the optoelectronic regenerator, the corresponding electrical signal electrically, and converting, by the optoelectronic regenerator, the regenerated electrical signal to a corresponding electromagnetic wave signal in an optical domain.

Although specific features, capabilities and advantages have been enumerated above, various embodiments may include some, none, or all of the enumerated features, capabilities and advantages. These and other technical features, capabilities and advantages of the disclosed subject matter, along with the invention itself, will be more fully understood after a review of the following figures, detailed descriptions and claims.

BRIEF DESCRIPTION OF THE DRAWINGS

Exemplary embodiments of the present invention will be described with references to the accompanying figures, wherein:

FIG. 4A is a cross-sectional view of interior surfaces of two opposing sides of the cubic cavity of FIG. 1, illustrating an electromagnetic wave beam traversing between the interior surfaces in accordance with an exemplary embodiment of the present invention.

FIG. 4B illustrates a signal directing element in accordance with an exemplary embodiment of the present invention.

FIG. 4E is a cross-sectional view of interior surfaces comprising signal focusing devices disposed on two opposing sides of the cubic cavity of FIG. 1, illustrating an electromagnetic wave beam traversing between the signal focusing devices in accordance with an exemplary embodiment of the present invention.

FIG. 8 is a cross-sectional view of the base of a tube cavity, illustrating the square area in the base of the tube used for capacity calculation in accordance with an exemplary embodiment of the present invention.

DETAILED DESCRIPTION OF PREFERRED EMBODIMENTS

Figure 1:
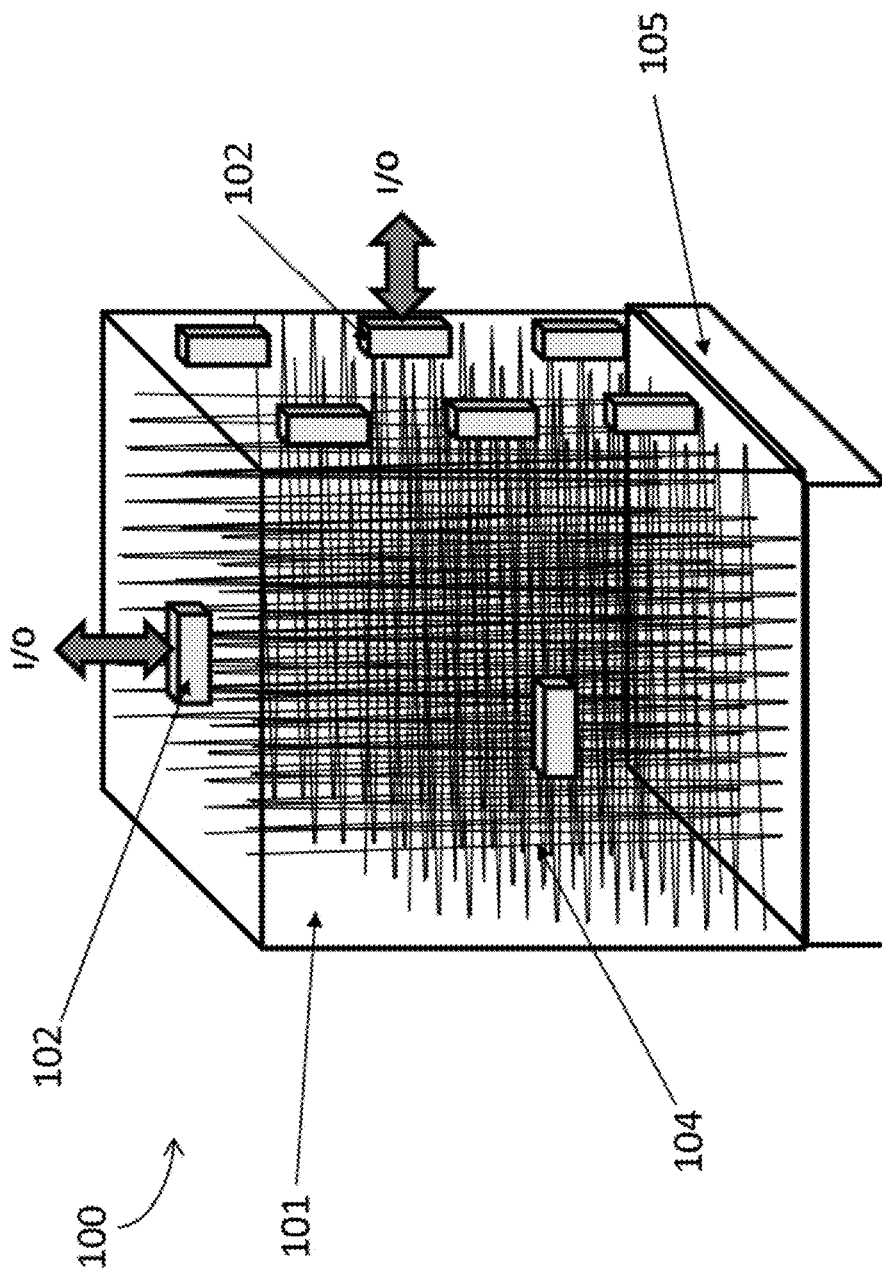
FIG. 1 is a schematic diagram of an exemplary embodiment of the present invention using a cubic cavity.

Information or any kind of data can be stored as electromagnetic waves (e.g., lasers, optical beam, radio frequency (RF) signals, other types of electromagnetic wave signals, to name a few), which can be transmitted and/or reflected between structures or within structures in various transmission media (e.g., free space, vacuum, crystals, nonlinear media, optical waveguides, optical fibers, to name a few).

The terms "electromagnetic wave signal" and "electromagnetic wave beam" are used herein interchangeably. Electromagnetic radiation or electromagnetic beam as used herein may include any kind of electromagnetic signal, including a laser beam or signal, a maser beam or signal, an optical beam or signal, or any type of wired or wireless signal, including acoustic waves, radio waves, IR radiation, UV radiation, microwave-band transmission, or any combination of more than one of the foregoing. While referred to herein sometimes simply as a laser beam or signal, other types of optical signals and other types of electromagnetic radiation transmissions, including radio waves, microwaves, IR, UV and combinations of bandwidths of wavelengths of electromagnetic radiation, whether guided, shaped, phased, or none of the foregoing, are also intended to be included.

A recirculating loop may be used to store "data in motion" by keeping electromagnetic wave signals carrying data in a continuous motion, transmitted and/or reflected between or within structures and regenerated (e.g., by signal amplification or regeneration) as needed. The recirculating loop may be formed by, for example, satellites or other vessels that reflect or otherwise retransmit the data in free space or through a waveguide, such as one or more pieces of optical fiber. The recirculating loop may also comprise a waveguide, such as an optical fiber. Various systems and methods of storing data in motion in a recirculating loop are described in U.S. patent application Ser. No. 15/465,356, which has been published as US 2017/0280211 A1 and is incorporated by reference herein in its entirety.

To increase the data storage time and capacity for such systems, electromagnetic wave signals need to be held or "delayed" in a recirculating loop as long as possible. There may be other applications for the delay of electromagnetic signals, such as the ability to use a shorter coherence length master oscillator in a long range lidar or radar.

A cavity may be configured to provide a recirculating loop for storing or containing electromagnetic wave signals such as data in motion. In addition, the cavity may be configured to provide various surfaces for electromagnetic wave signals to be reflected or redirected numerous times so as to accrue time-of-flight delays. As used herein, the term "cavity" refers to any structure that includes at least one partially or fully enclosed space (e.g., partly open or fully sealed enclosure) of any size or shape where an electromagnetic wave signal can travel. The enclosed space within a cavity may be hollow, and such a hollow space in a near vacuum condition has an index of refraction of approximately one, which allows electromagnetic wave signals to travel at near the speed of light in vacuum. Alternatively, the enclosed space within a cavity may be filled with a material (e.g., solid, crystal, amorphous material, liquid, etc.) having an index of refraction greater than one, where electromagnetic wave signals travel more slowly than in vacuum. In another example, a cavity may be a solid material (e.g., crystal, amorphous solid, to name a few) enclosed by its own interior and exterior surfaces. Preferably, such a material filling the cavity is configured to allow storage or containment of electromagnetic wave signals at a low loss.

As further described below, exemplary geometrical shapes of a cavity include a cubic cavity, a rectangular shaped cavity, a tube cavity, a torus shaped cavity, a spherical cavity, a polyhedron cavity, a parallelogram shaped cavity, a prism shaped cavity and an egg-shaped cavity, to name a few. In other words, a geometrical shape of the cavity can be constructed to fit in any available space in any structure, building, or device, to name a few, to create a data center or any kind of customer data computing and/or storage facility or device. For example, a shipping container, a closet, a room in a building, the inside of a multi-story building, or an enclosed football stadium can be a cavity that can provide a recirculating loop for storage of data in motion. In embodiments, the cavity may comprise a resonating optical cavity configured to create resonance at one or more frequencies of the electromagnetic wave signal.

An electromagnetic wave signal can be contained within the inside of a cavity by, for example, undergoing a series of reflections or traversals between interior surfaces of the cavity and/or between reflecting elements placed within the cavity. In embodiments, the electromagnetic wave signal may be of any type of electromagnetic wave beams and any combination of different electromagnetic wave beams. In embodiments, the electromagnetic wave signal may contain electromagnetic wave of any wavelength and may contain any number of different wavelengths. In embodiments, the electromagnetic wave signal may be of any spatial mode and may encompass any number of different spatial modes. For example, the electromagnetic wave signal to be contained within the inside of the cavity may comprise modulated laser beam, other types of modulated electromagnetic wave beam, Gaussian beam, electromagnetic wave beam in various spatial modes, such as circular mode, square mode, orbital angular mode (OAM), Hermite Gaussian, or Laguerre Gaussian, to name a few.

Within a given interior space provided by the cavity, the interior surfaces of the cavity and/or reflecting elements in the cavity can be configured to increase the path length and storage time of the electromagnetic wave signal traveling within the inside of the cavity. The path length of the electromagnetic wave signal is the distance traveled by the electromagnetic wave signal within the cavity, and the storage time is the path length of the electromagnetic wave signal divided by the speed of light or other electromagnetic wave signal (e.g., sound) carrying data in motion in the cavity. With a longer storage time and increased path length, one can store a greater amount of data in motion in a cavity without requiring a higher data rate at which the data is introduced into the cavity. In this regard, if the electromagnetic wave signal carrying data in motion is an acoustic wave, the much lower speed of sound (as compared to the speed of light) enables one to store a greater amount of data in motion in a cavity without requiring a higher data rate at which the data is introduced into the cavity.

In accordance with an exemplary embodiment, an apparatus for storing electromagnetic wave signals, such as data in motion, may include a cavity of any shape or size or dimensions. The cavity may be partially enclosed, having one or more openings between the interior space and the outside of the cavity. Alternatively, the cavity may be fully enclosed and substantially sealed, having no opening between the inside and the outside of the cavity.

To contain electromagnetic wave signals, the cavity may comprise interior surfaces or reflecting elements placed within the cavity, which create a recirculating loop for the electromagnetic wave signal to travel until retrieved from the cavity. All or only some portions of the interior surfaces of the cavity may be reflective. Some or all of the interior surfaces of the cavity may comprise any kind of reflective elements or material, such as mirrors, reflecting coatings, to name a few, or gratings, or any other photonic microstructure materials configured to reflect, regenerate, separate, and/or process the incident electromagnetic wave signal. In embodiments, the reflectivity of the interior surface may be as close to 1 as possible, since the high reflectivity of the interior surfaces would reduce any loss in the power and intensity of the electromagnetic wave signal due to reflection.

The exemplary apparatus may also include one or more transmitters and one or more receivers that may be used as input ports to introduce data in the form of modulated electromagnetic wave signals into the inside of the cavity and output ports to retrieve the electromagnetic wave signals from the inside of the cavity, respectively. The transmitter may be configured to receive an electronic or electrical signal (e.g., digital data) from the outside of the cavity or internal to the cavity, transform the electrical signal into an electromagnetic wave signal and introduce the electromagnetic wave signal into the inside of the cavity such that the electromagnetic wave signal travels and is contained within the cavity. It will be understood that the transmitter can put the electronic or electrical signal on the electromagnetic wave signal using any of the modulation schemes (e.g., QAM, NRZ, QPSK, etc.) and/or any of the digital signal processing techniques (e.g., error correction, etc.) known to those of ordinary skill in the art that are necessary to ensure error-free propagation of the data within the cavity. The transmitter may comprise at least one laser and at least one modulator. Alternatively, the transmitter may comprise at least one directly modulated laser. In embodiments, lasers for various different wavelengths within the reflection window may be used. The receiver may be configured to retrieve the electromagnetic wave signal from the inside of the cavity, transform the electromagnetic wave signal to a corresponding electrical signal (e.g., digital data) and transmit the corresponding electrical signal to the outside of the cavity. The receiver may comprise at least one photodetector. In embodiments, the apparatus may include one or more transceivers, in which at least one transmitter and at least one receiver are placed or combined together, either physically or functionally.

In embodiments, the apparatus for storing electromagnetic wave signals, such as data in motion, may further include one or more amplifiers and/or regenerators configured to restore some or all aspects of the electromagnetic wave signal to their original or previous conditions. In embodiments, the apparatus may further include one or more devices configured to clean up the electromagnetic wave signal contained and traveling within the inside of the cavity. An electromagnetic wave signal traveling within the inside of the cavity may experience loss in intensity and amplitude, spreading of the signal and/or addition of noise and errors due to, for example, multiple reflections at surfaces, various dispersive and nonlinear effects, perturbations of the cavity, random scattering events and/or spontaneous emission of light. Accordingly, the electromagnetic wave signal may need to be regenerated at various points in time or space while traveling within the cavity.

In embodiments, regenerators may be placed along the electromagnetic wave beam path and used to restore the passing electromagnetic wave signal to its original state and/or compensate for any degradation.

Full signal regeneration is typically called a "3R" process that includes signal re-timing, re-shaping, and re-amplification (or amplification) of the signal. A regenerator in the apparatus may be configured to conduct full electromagnetic wave signal regeneration. Alternatively, the regenerator in the apparatus may be configured to restore only some aspects of the electromagnetic wave signal by re-timing and/or re-shaping and/or re-amplification of the electromagnetic wave signal in part. In embodiments, the regenerator may also be configured to implement error correction to restore lost information or correct errors introduced into the data in motion. The number of regenerators for the apparatus may depend on the design of the cavity and performance of the cavity elements, and may span from none to a very large number.

Any apparatus configured to re-amplify, re-shape, and/or re-time the electromagnetic wave signal in full or in part may be used to build regenerators. Regenerators can be implemented in a number of ways. In embodiments, the regenerator may be an all-optical or an optoelectronic regenerator, wherein the all-optical regenerator is configured to regenerate the electromagnetic wave signal all optically in the optical domain, while the optoelectronic regenerator is configured to convert the electromagnetic wave signal to a corresponding electrical signal in the electrical domain, regenerate the converted electrical signal electrically and convert the regenerated electrical signal back to a corresponding electromagnetic wave signal in the optical domain. In embodiments, the regenerator may comprise at least one amplifier and at least one absorber. In embodiments, the regenerator may comprise at least one amplifier configured to operate in a saturation regime. In embodiments, an amplifier may be any device configured to amplify an optical signal. In embodiments, an amplifier may comprise crystals or optical fibers. In embodiments, the crystals and optical fibers may be doped by fluorescent elements. In embodiments, the optical fiber used in the amplifier may include additional device at the input to inject the optical signal into the optical fiber, and another device at the output to restore the optical beam to its original shape and size. In embodiments, the regenerator may comprise a nonlinear filter configured to provide gain stabilization and reduce noise in the electromagnetic wave signal. In embodiments, the regenerator may comprise crystals or optical fibers. In embodiments, the regenerator may comprise crystals or optical fibers that are doped. In embodiments, the crystals or optical elements may be doped by fluorescent elements. In embodiments, the optical fiber used in the regenerator may comprise an additional device at the input to inject the electromagnetic wave signal into the optical fiber, and another device at the output to restore the electromagnetic wave beam to its original shape and size.

In embodiments, the apparatus for storing electromagnetic wave signals may comprise a cavity, wherein the inside of the cavity is configured to enable an atmospheric pressure level that is different than (e.g., higher or lower than) the atmospheric pressure level at the outside of the cavity. In embodiments, the inside of the cavity may be configured to enable an atmospheric pressure level that is lower than the atmospheric pressure level outside the cavity. For example, this can be achieved with a vacuum pump or any other pressure lowering means. In embodiments, the apparatus for storing electromagnetic wave signals may further include a vacuum pump and/or other apparatus for creating a "cleanroom" type environment that can be used to maintain a desired level of vacuum condition within the inside of the cavity (e.g., vacuum, or at a low atmospheric pressure approaching a vacuum). Alternatively, the apparatus in its entirety may be placed in a vacuum, such as in outer space, as another way to provide a vacuum condition in the cavity. By maintaining the inside of the cavity substantially under a vacuum condition, atmospheric effects on the electromagnetic wave signal are reduced or eliminated and the electromagnetic wave signal traveling within the inside of the cavity would experience negligible power loss or data degradation. For example, dust and other small particles can cause diffractions of the electromagnetic waves of the electromagnetic wave signal. Dust and other small particles can be eliminated in a substantially sealed cavity under a vacuum condition. Similarly, a vacuum pump and/or other apparatus for creating a "clean-room" type environment may be used to reduce or eliminate dust and other small particles present in a partially sealed cavity. In addition, propagation of light or electromagnetic wave signal in vacuum generates negligible heat, thus reducing the need for a cooling system for the apparatus.

In accordance with an exemplary embodiment, a method of storing electromagnetic wave signals, such as data in motion, may comprise the following process. An electrical signal (e.g., electronic digital data) from the outside of a cavity may be received by the one or more transmitters, which transforms the received electrical signal into an electromagnetic wave signal. It will be understood that the transmitter can put the electrical signal on the electromagnetic wave signal using any of the modulation schemes (e.g., QAM, NRZ, QPSK, etc.) and/or any of the digital signal processing techniques (e.g., error correction, etc.) known to those of ordinary skill in the art that are necessary to ensure error-free propagation of the data within the cavity. The transmitter introduces the electromagnetic wave signal into the inside of the cavity, in which the electromagnetic wave signal is contained by undergoing a series of reflections or traversals between interior surfaces or reflecting elements of the cavity. The electromagnetic wave signal may be retrieved from the inside of the cavity and transformed to a corresponding electrical signal (e.g., electronic digital data) by one or more receivers. The receivers may then transmit the corresponding electrical signal to the outside of the cavity.

In embodiments, to compensate for any degradation of the electromagnetic wave signal while traveling within the inside of the cavity, one or more regenerators may be used to restore the electromagnetic wave signal to its original or previous amplitude or wave shape. In embodiments, to reduce or eliminate atmospheric effects on the electromagnetic wave signal, an atmospheric pressure level at the inside of the cavity may be different than an atmospheric pressure level at the outside of the cavity. For example, the atmospheric pressure level at the inside of the cavity may be lowered below an atmospheric pressure level at the outside of the cavity. This step may be performed by, for example, a vacuum pump, other apparatus for creating a "clean-room" type environment, and/or any pressure lowering means. In embodiments, the inside of the cavity may be maintained substantially under a vacuum condition, using a vacuum pump.

The data storage capacity of the cavity may depend on the size of the optical path length L, the bandwidth B or wavelength range used, the modulation format used (e.g., # bits/symbol and type of signal modulation) and the number of electromagnetic modalities used by the electromagnetic wave signal (e.g., lasers, polarization, or spatial multiplexing) used per frequency/wavelength M. The electromagnetic wave signal may be of any spatial transverse and/or longitudinal shape (e.g., circular, square, orbital angular modes, to name a few) depending on the design of the cavity. For example, the overall data storage capacity of the cavity may be calculated by: M×L×B/2×(# bits/symbol)/v, where v is the speed of propagation of the electromagnetic wave signal inside the cavity. If the cavity is under a vacuum condition, then the speed of the electromagnetic wave signal will be the speed of light in a vacuum. One can increase the data storage capacity of the cavity by, for example, extending the bandwidth or the modes of the electromagnetic wave signal contained in the cavity (e.g., by using additional forms of multiplexing), without having to add more footprint and/or replace the existing hardware.

In embodiments, the apparatus for storing electromagnetic wave signals, such as data in motion, may also be configured to delete data in motion stored in the cavity by extinguishing or "turning off" the electromagnetic wave signal contained in the cavity. When the electromagnetic wave signal is extinguished, data stored therein is definitively and instantly lost and cannot be recovered, unlike the data erased from a solid-state memory.

Referring now to the drawings and in particular to FIG. 1, there is depicted an exemplary embodiment in the form of an apparatus 100 for storing data in motion using a cubic cavity 101. While the cavity walls may be opaque and may not be necessarily transparent or semi-transparent, FIG. 1 depicts the cubic cavity 101 as if its cavity walls are transparent so as to show electromagnetic wave signals 104 traversing between the interior surfaces of the cavity within the inside of the cavity. As shown in FIG. 1, the electromagnetic wave signals are contained within the inside of the cavity 101 by undergoing a series of reflections or traversals between the interior surfaces of the cavity.

Some or all portions of the interior surface of each of the six sides of the cubic cavity 101 may be reflecting to allow reflections of the incident electromagnetic wave signals. In embodiments, some portions of the interior surfaces of the cavity may be non-reflecting and instead opaque or transparent to facilitate the operational design of the apparatus. The interior surfaces of the cavity 101 may use any kind of reflective elements or material, such as mirrors, reflecting coatings, to name a few, or gratings, or any other photonic microstructure materials configured to reflect, regenerate, separate, and/or process the incident electromagnetic wave signal. The reflectivity of a surface is defined by the power of the reflected light or electromagnetic wave signal ($P_r$) divided by the power of the incident light or electromagnetic wave signal ($P_i$), and is less than or equal to 1. In embodiments, the reflectivity of the interior surfaces of the cubic cavity 101 is as close as possible to 1.

As shown in FIG. 1, the exemplary apparatus 100 for storing electromagnetic wave signals, such as data in motion, may include one or more optical processing units (OPUs or "tap points") 102. Each OPU 102 may be configured to function as an input/output (I/O) port to receive electrical signals, such as digital data, to store in the cavity 101 as electromagnetic wave signals and access and retrieve the stored electromagnetic wave signals from the cavity 101. The number and locations of the OPUs for the apparatus are not limited to those shown in FIG. 1, and can be arbitrary and flexible to accommodate any number and arrangement of computing units, devices, and/or data centers coupled to the apparatus. In embodiments, one or more OPUs 102 can be located inside the cavity 101.

Each OPU 102 may include multiple function sub-assemblies and may contain one or more of transmitter, receiver, regenerator and other functional sub-assemblies for electronic and/or photonic processing. The general purpose of the transmitter is to write data into the cavity 101. To do so, the transmitter may be configured to transform an electrical signal, such as digital data, into an electromagnetic wave signal 104 carrying data in motion, using, for example, laser light. The transmitter may comprise a laser and a modulator, or a directly modulated laser. Different wavelengths for the laser may be used for the electromagnetic wave signal as long as they are within the reflection window of the cavity 101. The OPU 102 may contain as many transmitters as needed. Each transmitter may also contain as many digital and/or photonic sub-assemblies as needed to modulate the electromagnetic wave signal 104 with any complex format and/or to generate any transverse spatial mode for beam shape of the electromagnetic wave signal.

The general purpose of a receiver is to read data from the cavity 101. A receiver may comprise a photodetector configured to transform the electromagnetic wave signal 104 into an electrical signal, such as electronic digital data. The OPU 102 may contain as many receivers as needed. Each receiver may also contain digital and/or photonic sub-assemblies for error correction or other digital processing purposes.

In embodiments, the OPU 102 may also include one or more regenerators configured to regenerate the electromagnetic wave signal 104 traveling in the cavity 101. The regenerator may be configured to re-amplify and/or re-time and/or re-shape the electromagnetic wave signal. The regenerator may also be configured to implement error correction to restore lost information (e.g., lost bits of data) in the electromagnetic wave signal. The regenerator may comprise an all-optical regenerator or an optoelectronic regenerator.

In embodiments, the OPU 102 may also be configured to delete data in motion stored in the cavity by extinguishing or "turning off" the electromagnetic wave signal. When the electromagnetic wave signal is extinguished, data stored therein is definitively and instantly lost and cannot be recovered, unlike the data erased from a solid-state memory.

Figure 2:
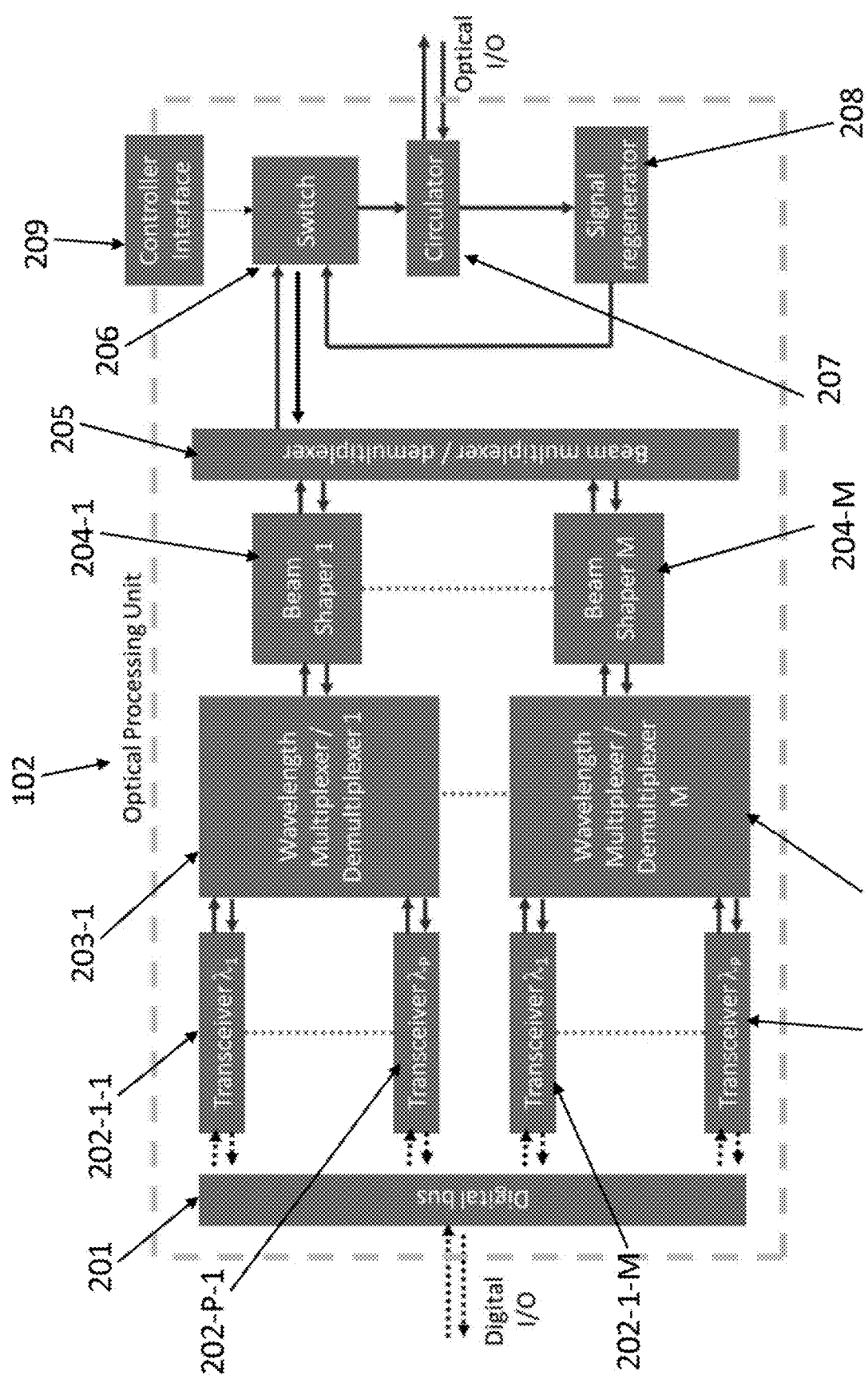
FIG. 2 is a schematic diagram of an optical processing unit, schematically illustrating its components and their interconnections in accordance with an exemplary embodiment of the present invention.

FIG. 2 provides a schematic diagram of an OPU 102 in accordance with an exemplary embodiment. As shown in the figure, electronic digital data is input to or output from the OPU 102 through a digital bus 201. The digital bus 201 is coupled to one or more transceivers 202. Each transceiver 202 may comprise at least one transmitter and at least one receiver. In embodiments, the OPU 102 may include multiple transceivers corresponding to different wavelengths of the electromagnetic wave signals. Any wavelength and any number of different wavelengths may be used. In addition, the OPU 102 may further include multiple transceivers corresponding to different spatial modes of the electromagnetic wave signals. Any spatial modes and any number of different spatial modes can be used.

For example, FIG. 2 shows that the OPU 102 includes multiple transceivers each corresponding to each of P different wavelengths and each of M different spatial modes, i.e., total of P×M transceivers (Transceiver 202-1-1 for $\lambda_1$ and spatial mode 1, . . . , Transceiver 202-P-1 for $\lambda_P$ and spatial mode 1, . . . , Transceiver 202-1-M for $\lambda_1$ and spatial mode M, . . . , Transceiver 202-P-M for $\lambda_P$ and spatial mode M). Each of the transceiver 202-1-x through transceiver 202-P-x may be configured to transform the digital data received through the digital bus 201 into an electromagnetic wave signal having the corresponding wavelength $\lambda_1$, . . . , or $\lambda_P$. It will be understood that each transceiver can put the electronic or electrical signal on the electromagnetic wave signal using any of the modulation schemes (e.g., QAM, NRZ, QPSK, etc.) and/or any of the digital signal processing techniques (e.g., error correction, etc.) known to those of ordinary skill in the art that are necessary to ensure error-free propagation of the data within the cavity.

In embodiments, the OPU 102 may also include one or more wavelength division multiplexers/demultiplexers. For example, FIG. 2 shows that the OPU 102 includes multiple wavelength division multiplexers/demultiplexers 203-1, . . . , 203-M, each corresponding to one of M different spatial modes of the electromagnetic wave signal. Each wavelength division multiplexer 203 may be configured to combine different electromagnetic wave beams of distinct wavelengths into a single electromagnetic wave beam, while each wavelength division demultiplexer 203 may be configured for the reverse function, i.e., separating an electromagnetic wave beam containing many wavelengths into electromagnetic wave beams of distinct wavelengths. Each wavelength division multiplexer/demultiplexer may be implemented by using a set of filters, prisms, resonators, and/or gratings, which are configured to redirect an electromagnetic wave beam based on its wavelength.

As shown in FIG. 2, the electromagnetic wave beams from the transceivers 202-1-x through 202-P-x having P different wavelengths may be combined by the wavelength division multiplexer 203-x into a single electromagnetic wave beam, which may be further processed by a beam shaper 204-x corresponding to spatial mode x. For example, the OPU 102 may include M beam shapers 204-1, . . . , 204-M corresponding to M different transverse spatial modes as shown in FIG. 2. Each beam shaper 204 may be configured to transform an incoming electromagnetic wave beam into an electromagnetic wave beam having a specific beam profile (e.g., specific transverse spatial mode). Any spatial mode and any number of different spatial modes can be generated by these beam shapers. In embodiments, the beam shaper 204 may comprise a liquid-crystal-based spatial light modulator, which can be reprogrammed. Alternatively, the beam shaper 204 may comprise a phase mask having reflective or transparent surfaces that can modify the phase of the electromagnetic wave beam with respect to its transverse spatial location.

In embodiments, the OPU 102 may also include a spatial mode multiplexer/demultiplexer 205. A spatial mode multiplexer 205 may be configured to combine electromagnetic wave beams of different beam profiles (e.g., having different transverse spatial modes) into a single beam containing all of the incoming beam profiles (e.g., transverse spatial modes). On the other hand, a spatial mode demultiplexer 205 may be configured to perform the reverse function, i.e., separating an electromagnetic wave beam containing many beam profiles (e.g., transverse spatial modes) into electromagnetic wave beams having distinct beam profiles (e.g., transverse spatial modes). In embodiments, a spatial mode multiplexer may comprise couplers or combiners, which may be implemented using a combination of beam splitters that combine two incoming electromagnetic wave beams into one. In embodiments, a spatial mode demultiplexer may comprise beam splitters used in the other direction such that the incoming electromagnetic wave beam is broadcasted into different paths. On each path, one may then use a spatial filter comprising a spatial light modulator or a phase mask, which is configured to separate the different beam profiles (e.g., transverse spatial modes).

As shown in FIG. 2, electromagnetic wave beams from the beam shapers 204-1, 204-M having M different transverse spatial modes may be combined by the spatial mode multiplexer 205 into a single electromagnetic wave signal, which now contains P different wavelengths and M different spatial modes. This electromagnetic wave signal may be sent to a switch 206, which may be controlled by a controller interface 209. When the switch 206 is on, the electromagnetic wave signal, which is generated based on the received electrical signal, such as digital data, and processed by the OPU 102 to include P different wavelengths and M different spatial modes, is introduced into the inside of the cavity 101 through, for example, an optical circulator 207. An optical circulator is a multi-port optical device configured such that an electromagnetic wave beam entering any of the ports exits from the next port.

In embodiments, the OPU 102 may include one or more regenerators 208. For example, an electromagnetic wave signal contained in the cavity 101 may be retrieved from the inside of the cavity through the circulator 207 and sent to the regenerator 208 for full or partial regeneration. The regenerated electromagnetic wave signal from the regenerator 208 may then be sent to the switch 206 so that the regenerated electromagnetic wave signal can be re-introduced into the inside of the cavity 101 through the optical circulator 207 as shown in FIG. 2.

In embodiments, the OPU 102 shown in FIG. 2 may also allow reading or retrieval of electromagnetic wave signal (e.g., electromagnetic wave signal carrying data in motion) stored in the cavity 101 as follows: An electromagnetic wave signal may be retrieved from the cavity 101 through the circulator 207, regenerated by the regenerator 208 and sent to a single 2×2 switch 206. Alternatively, two 1×2 optical switches may be used in place of the single switch 206. The electromagnetic wave signal may then be demultiplexed into electromagnetic wave beams having different transverse spatial modes and different wavelengths by the spatial mode demultiplexer 205 and the wavelength demultiplexers 203, respectively. The transceivers 202 may then transform the electromagnetic wave signal back to a corresponding electrical signal in the electronic domain and send the corresponding electrical signal to the outside of the cavity through the digital bus 201.

Figure 3:
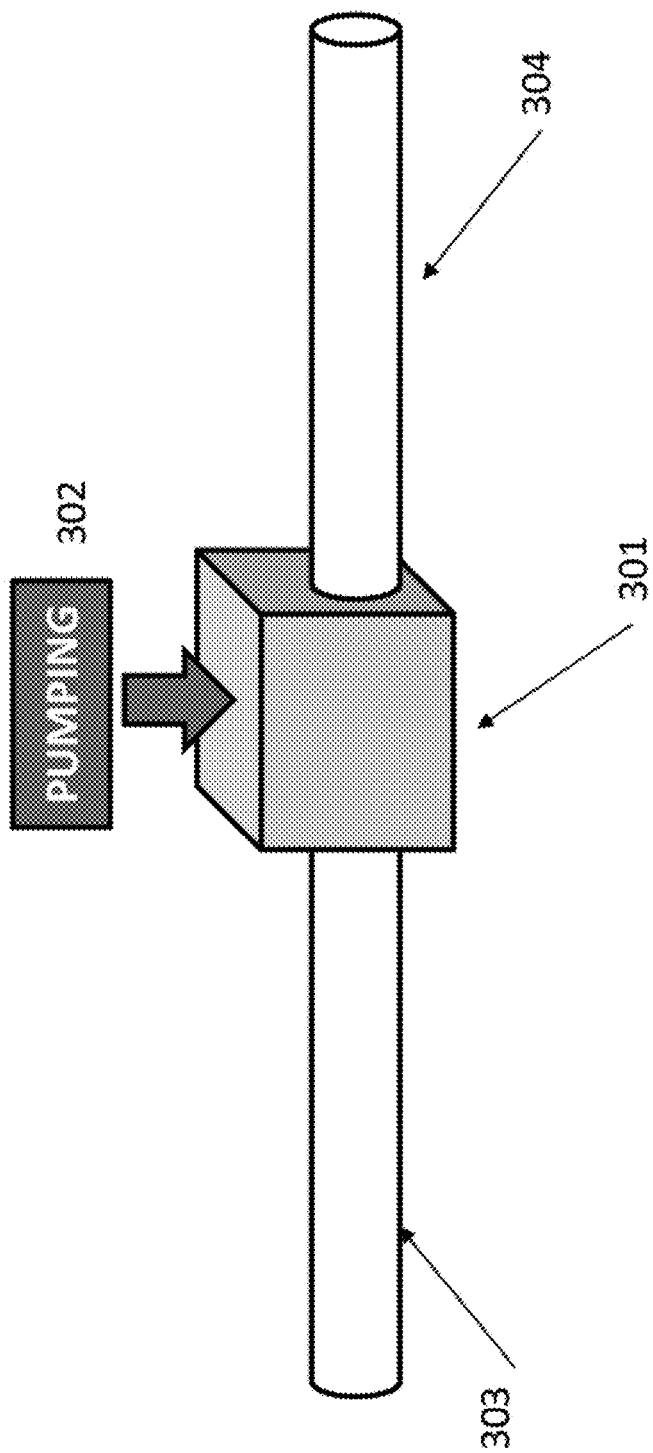
FIG. 3 is a schematic diagram of a regenerator and its operation in accordance with an exemplary embodiment of the present invention.

In embodiments, one or more regenerators, separate from any OPU 102, may be placed along optical path within the inside of the cavity 101. For example, FIG. 3 illustrates the operation of an exemplary regenerator 301 placed within the inside of the cavity. The regenerator 301 may comprise amorphous non-crystalline solid materials or a stack of crystals with compensating properties. Preferably, the regenerator 301 is configured to re-amplify, re-shape, and/or re-time the electromagnetic wave signal beam, e.g., incoming faint electromagnetic wave signal beam 303, to a regenerated electromagnetic wave signal beam 304, without changing its shape and/or adding noise to the electromagnetic wave signal. Preferably, the regenerator 301 is configured to allow efficient energy transfer from a pump 302 to the electromagnetic wave signal 304. In embodiments, the pumping of the crystal in the regenerator 301 may be conducted through electricity or by an optical laser attached to the crystal. The crystal of the regenerator 301 may be highly nonlinear or eventually doped with fluorescent elements. In embodiments, the regenerator 301 may be an all-optical regenerator or an optoelectronic regenerator.

Figure 7A:
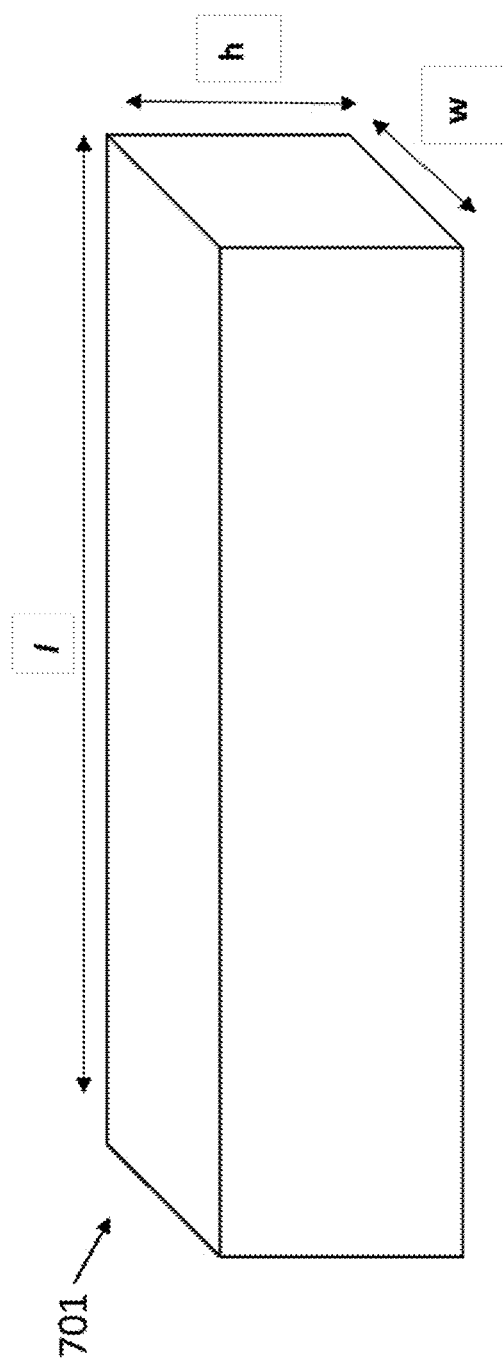
FIG. 7A is an isometric view of a rectangular cavity in accordance with an exemplary embodiment of the present invention.
Figure 7B:
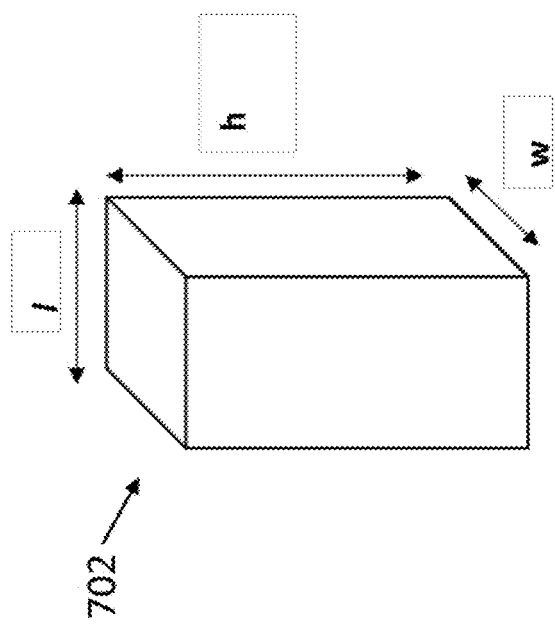
FIG. 7B is an isometric view of a rectangular cavity in accordance with another exemplary embodiment of the present invention.
Figure 9:
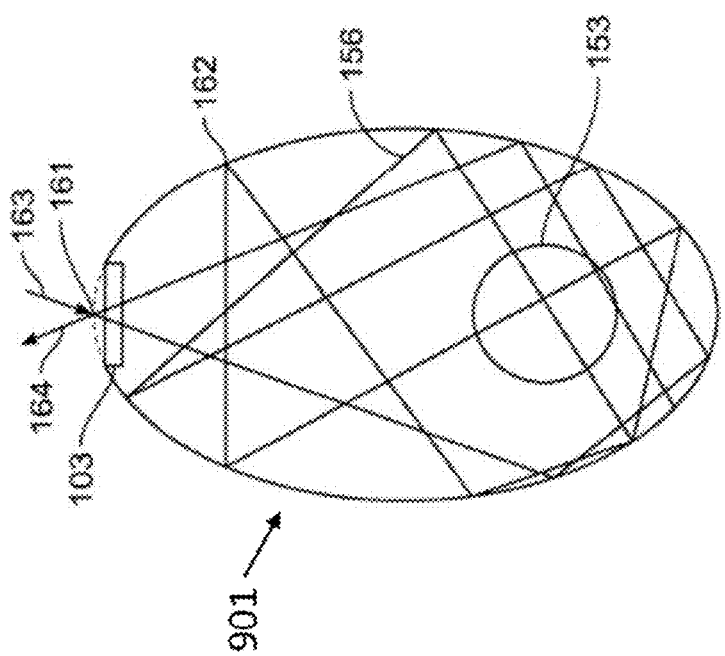
FIG. 9 is a cross-sectional view of an egg-shaped cavity, illustrating an electromagnetic wave signal traversing between the interior surfaces of the cavity in accordance with an exemplary embodiment of the present invention.

The OPU 102 shown in FIG. 2 may be used not only for cubic cavities, such as the cubic cavity 101 shown in FIG. 1, but also for cavities of any size or shape, including rectangular shaped cavities, such as those shown in FIGS. 7A-7B, tube cavities, such as the tube cavity 801 shown in FIG. 8, egg-shaped cavities, such as the egg-shaped cavity 901 in FIG. 9, and resonating cavities, to name a few.

Referring back to FIG. 1, the exemplary apparatus 100 for storing electromagnetic wave signals may optionally include a vacuum pump 105 in accordance with an exemplary embodiment. The vacuum pump 105 may be used to ensure that a desired level of vacuum condition is maintained within the inside of the cavity 101. Vacuum can be used to maintain a desired quality or strength of the electromagnetic wave signal beams 104 by reducing or eliminating atmospheric distortions or dust particles within the cavity 101.

Referring now to FIG. 4A, there is depicted a cross-sectional view of the interior surfaces 402 of two opposing sides of the cubic cavity 101, illustrating an electromagnetic wave beam 401 traversing between the interior surfaces in accordance with an exemplary embodiment of the present invention. The electromagnetic wave beam 401 has a transversal spot size (or a diameter if the electromagnetic wave beam is circular) of s. The spot of the electromagnetic wave beam may be of any shape depending on the transverse spatial mode or beam shape of the electromagnetic wave beam 401.

As shown in FIG. 4A, the OPU 102 or a transmitter of the apparatus 100 may be configured to let the electromagnetic wave beam 401 enter the inside of the cavity 101 from a corner 403 of the cube in parallel with the upper side of the cavity. However, the location and manner of entry of the electromagnetic wave beam into the cavity are not restricted by the present invention and an electromagnetic wave beam may enter the cavity from any location of the cavity wall in any manner.

On each of the two opposing sides of the cubic cavity 101, a set of tilted mirrors 402 may be placed. Each of these mirrors 402 may be configured to reflect the incident electromagnetic wave beam to the next mirror on the opposite side in such a way that the electromagnetic wave beam 401 travels between the interior surfaces on two opposing sides of the cubic cavity 101 in a zig-zag manner as shown in FIG. 4A.

In embodiments, the mirrors 402 may be further configured to reflect the incident electromagnetic wave beam to the next mirror on the opposite side such that the electromagnetic wave beam 401 travels in a zig-zag manner in a plane that is substantially perpendicular to the two opposing sides of the cubic cavity 101. For example, each of the mirrors 401 may be tilted at an angle $\alpha = \sin^{-1}(s/(2\sqrt{(c^2+s^2)}))$ with respect to the corresponding side of the cube, where c is the side length of the cubic cavity 101 and s is the transversal spot size of the electromagnetic wave beam. As shown in FIG. 4A, the electromagnetic wave beam 401 may sweep through in a zig-zag manner a slice of the cubic cavity having the surface area of $c^2$ and thickness of s by being reflected by these mirrors 402 on the opposite sides of the cube. In embodiments, the tilted mirrors 402 may also include optical power to focus or defocus the incident electromagnetic wave beam. In embodiments, the tilted mirrors 402 may be configured to refocus the electromagnetic wave beam to keep it small. In embodiments, instead of tilted mirrors, signal focusing devices, photonic structures, diffraction structures, metamaterials, or other optical elements may be placed on the sides of the cubic cavity to deflect the electromagnetic wave beam by a desired angle (e.g., angle $\alpha$).

The cavity 101 may further include a signal directing device or element configured to direct the traveling electromagnetic wave beam to a different direction. For example, a signal directing element 404 may be placed at the corner diagonally opposite to the point 403 where the electromagnetic wave beam was introduced into the inside of the cavity 101, as shown in FIG. 4A. The signal directing element 404 may be configured to direct the electromagnetic wave beam 401 by an angle (e.g., angle $\alpha$) with respect to a plane perpendicular to the plane of the electromagnetic wave beam propagation 401 shown in FIG. 4A. For example, the signal directing element 404 may comprise a mirror, which is slightly larger than the electromagnetic wave beam size and may be placed adjacent to the corner and tilted at the angle (e.g., angle $\alpha$) with respect to the plane of the electromagnetic wave beam propagation 401. Alternatively, the signal directing element 404 may comprise other optical elements or materials, such as transparent materials having refractive indices designed to direct the electromagnetic wave beam in a desired manner, waveguides, gradient index (GRIN) materials, prisms, or any suitable combination of any of these elements and materials. While these optical materials and elements may be limited in bandwidth, using a suitable combination of these materials and elements would overcome their limitations.

The electromagnetic wave beam may be directed by the signal directing element 404 to another signal directing element on the opposite side of the cube, for example, a mirror 405 tilted at angle α with respect to a plane parallel to the plane of the previous electromagnetic wave beam propagation as shown in FIG. 4B. This signal directing element 405 may be configured to direct the electromagnetic wave beam by, for example, angle −α such that the propagation of the electromagnetic wave beam becomes parallel to the plane of its previous propagation as shown in FIG. 4A. After reflected by the signal directing element 405, the electromagnetic wave beam 401 starts traveling in a next plane, which is parallel to and adjacent to the plane of its previous propagation in FIG. 4A, in a zig-zag manner by being reflected by mirrors 402 shown in FIG. 4B.

In embodiments, the cavity 101 may further comprise additional signal directing elements such that the electromagnetic wave beam 401 may sweep the volume of the cubic cavity 101 in one direction by repeating the above-described process of reflection (e.g., zig-zagging in x-y plane) and directing to the next level (e.g., directed in z-direction by signal directing elements 404, 405).

In embodiments, the cavity 101 may further comprise additional signal directing elements configured to direct the electromagnetic wave beam in a direction perpendicular to the previous propagation direction such that, when the volume of the cubic cavity 101 has been swept by the electromagnetic wave beam in one direction, the signal directing elements may be configured to direct the electromagnetic wave beam to propagate in a plane (e.g., x-z plane) within the cubic cavity that is perpendicular to the initial plane of propagation (e.g., x-y plane). For example, at the location where the electromagnetic wave beam has finished sweeping the volume of the cubic cavity in one direction, a mirror slightly larger than the electromagnetic wave beam size may be placed to direct the electromagnetic wave beam by 90°. To do so, the mirror is tilted at an angle of 45° with respect to the side wall of the cavity, which is parallel to the direction of the incoming electromagnetic wave beam. Alternatively, the signal directing elements may comprise other optical elements or materials, such as transparent materials having refractive indices designed to direct the electromagnetic wave beam in a desired manner, waveguides, gradient index (GRIN) materials, prisms, or any suitable combination of any of these elements and materials. While these optical materials and elements may be limited in bandwidth, using a suitable combination of these materials and elements would overcome their limitations.

In embodiments, the propagation of the electromagnetic wave beam in a plane perpendicular to the initial plane of electromagnetic wave beam propagation may be achieved by reflections between mirrors placed on the other two different sides of the cube in an arrangement analogous to what is shown in FIG. 4A. When the cubic cavity 101 has been swept a second time (e.g., zig-zagging in x-z plane), other signal directing elements may be provided in the cavity 101 to direct the electromagnetic wave beam in a perpendicular direction such that the electromagnetic wave beam propagates in a plane (e.g., zig-zagging in y-z plane) perpendicular to the two planes of propagation (e.g., x-y and x-z planes) previously used by the electromagnetic wave beam. In this way, the electromagnetic wave beam may sweep the cavity 101 a third time in a direction perpendicular to the two previous sweeps.

In embodiments, after the electromagnetic wave beam has swept the cubic cavity 101 a third time, additional signal directing elements, such as a mirror positioned perpendicular to the direction of the electromagnetic wave beam propagation, may be used to reflect the electromagnetic wave beam in the opposite direction such that the electromagnetic wave beam can start sweeping the volume of the cubic cavity 101 in reverse directions another three times.

Referring back to FIG. 4A, assuming that s is small compared to c and thus angle α is small, in each plane of the electromagnetic wave beam propagation, the electromagnetic wave beam 401 bounces 2c/s times from the interior surfaces 402 and travels approximately a distance of c after each bounce. Hence, the path length of the electromagnetic wave beam per plane is $2c^2/s$. Assuming that all sides of the cubic cavity 101 have the same arrangement of the interior surfaces as those shown in FIG. 4A, the path length of the electromagnetic wave beam sweeping through the volume of the cubic cavity six times in three perpendicular directions is $L=12c^3/s^2$.

Depending on the reflectivity of the interior surfaces, such as mirrors, amplifiers and/or regenerators may be placed along the electromagnetic wave beam path to restore the electromagnetic wave signal to its original intensity and shape, as, for example, discussed above in connection with FIG. 3. In addition, by achieving a vacuum condition within the inside of the cavity 101 by, for example, a vacuum pump 105, the electromagnetic wave beam is not absorbed during propagation between two interior surfaces (e.g., mirrors 402). Under such condition, it may be possible to use the entire spectrum of available lasers to extend the bandwidth, thereby expanding the data storage time and capacity for the cavity.

In addition, various optical apparatus may be used in the cavity to refocus or reshape the electromagnetic wave beam traveling within the cavity. For example, one or more of lenses, gratings, metamaterials, and other optical elements or materials configured to modify the wave-fronts of the electromagnetic wave beam may be used to construct such optical apparatus.

The beam size of the electromagnetic wave signal may be an important factor in the data storage capacity of the cavity. The beam waist of an electromagnetic wave beam as a function of distance R is given by (1):

$$w(R) = w_0 \sqrt{1 + \left(\frac{R}{R_f}\right)^2}, \quad (1)$$

where $w_0 = \sqrt{(\lambda R_f/\pi)}$ and where λ is the wavelength of the electromagnetic wave beam and $R_f$ is the Rayleigh range.

Figure 5:
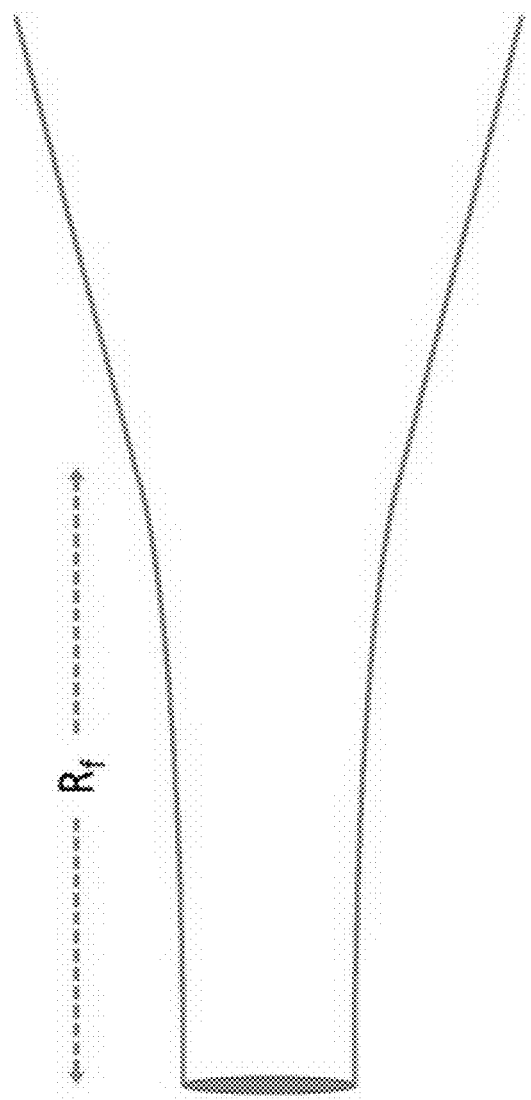
FIG. 5 illustrates the Rayleigh range of a collimated electromagnetic wave beam.

If a collimated beam is emitted from an aperture, then the beam waist and its diameter expand by a factor of √2 outside the Rayleigh range, $R_f$, where the far field begins. FIG. 5 shows how a collimated beam remains collimated in the near field within the Rayleigh range $R_f$ and starts diverging at a constant angular beam width outside the Rayleigh range.

Figure 6:
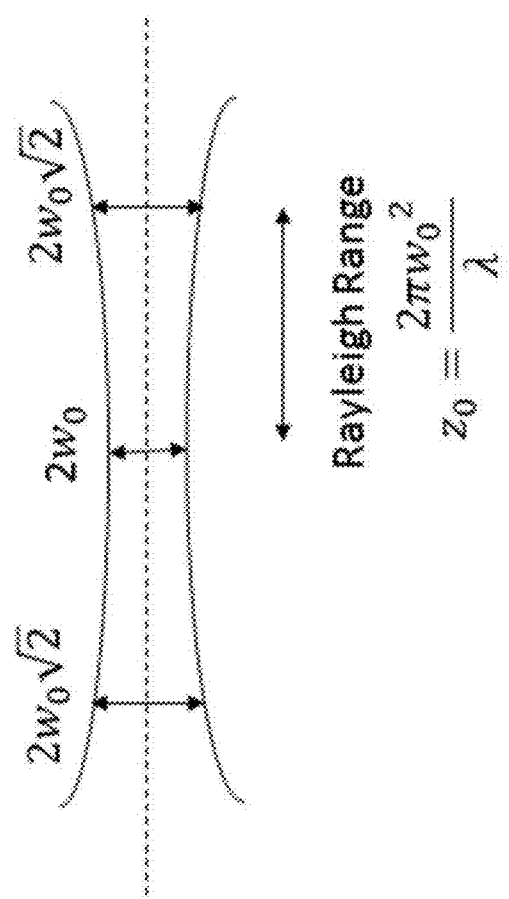
FIG. 6 illustrates a Gaussian beam propagating within its Rayleigh range centered on its focal spot.

In embodiments, the reflecting surface may be used to focus the electromagnetic wave beam between the two reflecting surfaces, instead of using a curved surface to restore the reflected electromagnetic wave to a collimated wave. In that case, the electromagnetic wave beam has the same size on the opposite reflecting surface instead of being larger by a factor of $\sqrt{2}$. For example, FIG. 6 shows that the electromagnetic wave beam size is the same on both sides of the focal spot.

The electromagnetic wave beam size may be kept small in order to store the maximum amount of data in the cavity. Furthermore, to avoid excessive power loss, each focusing element is preferably configured to capture a high percentage of the electromagnetic wave beam. To capture a high percentage of the electromagnetic wave beam, the diameter D of optical elements, such as apertures, lens, mirrors, etc., may be expanded by a factor of 1.5, corresponding to 3 times the waist $w_0$, as shown in (2):

$$D = 3\sqrt{(\lambda R_f/\pi)}, \qquad (2)$$

In embodiments, spatial modes, such as OAM modes, may be used along with Gaussian modes to increase data storage capability. Such fundamental Gaussian beams are electromagnetic wave beams with the lowest known divergence. If OAM modes are used, then the electromagnetic wave beam size may be set based on a design wavelength and many OAM modes may be included at shorter wavelengths, within the same beam size. In accordance with an exemplary embodiment of spatial multiplexing, the beam waist for OAM modes at any given range increases as the square root of the absolute value of the OAM mode number L. As such, the formula (2) for the beam diameter D can be modified to (3):

$$D = 3\sqrt{(\lambda R_f(\sqrt{L})/\pi)}, \qquad (3)$$

with the assumption that the electromagnetic wave beam diameter is the same on both ends of the link.

In embodiments, an electromagnetic wave beam for a Gaussian mode with a certain design wavelength may be used for data storage. At shorter wavelengths, the beam size may be kept the same by using more OAM modes. The shorter the wavelength the more OAM modes can be used.

In embodiments, electromagnetic wave signals may be stored within a cavity having two parallel reflecting plates facing each other with a distance of the Rayleigh range between them. For example, data in motion may be stored in the cavity by an electromagnetic wave beam traveling back and forth in one direction between the two reflecting plates. The diameter of the electromagnetic wave beam is expanded by a factor of $\sqrt{2}$ when it hits the opposite plate. In this case, the far field angular diffraction limit need not be used because the distance between the plates is at the transition between the near and far fields.

Figure 4C:
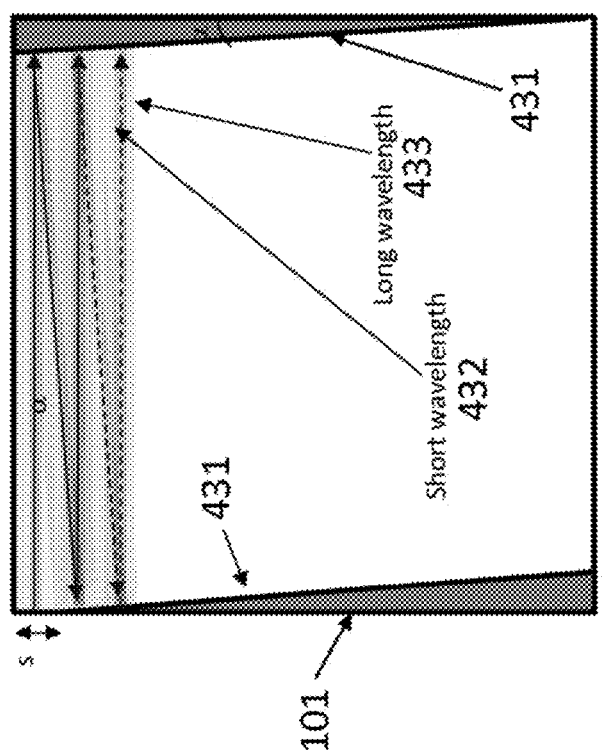
FIG. 4C is a cross-sectional view of interior surfaces of two opposing sides of the cubic cavity of FIG. 1, illustrating an electromagnetic wave beam traversing between the interior surfaces in accordance with an exemplary embodiment of the present invention.

Referring now to FIG. 4C, there is depicted a cross-sectional view of the cubic cavity 101 having two tilted continuous mirror plates 431 on two opposing sides of the cavity in accordance with another exemplary embodiment. To minimize the beam spot size of an electromagnetic wave beam when it reaches the reflecting elements on the interior surfaces of the cavity, the electromagnetic wave beam preferably reaches its minimum size halfway between the two opposite cubic side walls. In addition, to capture a high percentage (e.g., more than 99%) of the electromagnetic wave beam at the receiver, the aperture preferably has a diameter of at least $s = 3\sqrt{(\lambda c/\pi)}$, where $\lambda$ is the wavelength of the electromagnetic wave beam and c is the side length of the cubic cavity 101.

For multi-wavelength electromagnetic wave beams, the transversal spot size of the electromagnetic wave beam may be different depending on the wavelength of the electromagnetic wave beam. As shown in FIG. 4C, the electromagnetic wave beam 432 having a short wavelength has a smaller spot size, while the electromagnetic wave beam 433 having a long wavelength has a larger spot size. Accordingly, to make sure that no electromagnetic wave beam is overlapping, the highest wavelength may be used to calculate the angle $\alpha$ at which the two mirror plates 431 are tilted with respect to the corresponding side of the cube. Since small portions (e.g., less than 1%) of the electromagnetic wave beam at the highest wavelength may still be overlapping, to not lose those portions of the electromagnetic wave beam, continuous mirrors 431 or signal focusing devices may be used as interior surfaces on the side walls of the cubic cavity 101 as shown in FIG. 4C. In practice, the highest wavelength would range from 1 μm to 20 μm, which corresponds to an angle ranging from $5 \times 10^{-4}$ radians to $10^{-2}$ radians. In such a case, the upper range for the optical path length would be given by $L = 4c^2 \pi/(3\lambda)$, where c is the side length of the cubic cavity and $\lambda$ is the wavelength of the electromagnetic wave signal.

In embodiments, the electromagnetic wave beam in the cavity 101 may be focused to a smaller spot size before and/or after hitting the interior surfaces or reflective elements of the cavity to increase the path length of the electromagnetic wave beam. This could be achieved by, for example, placing, on or adjacent to the interior surface of the cavity, one or more signal focusing devices, which are optical devices configured to focus each electromagnetic wave beam to a small spot size (e.g., down to a few μm), even though the electromagnetic wave beams may be overlapping. In embodiments, the signal focusing device can also be placed on, or adjacent to, any reflective element placed anywhere within the cavity. In embodiments, the signal focusing device may be configured to differentiate between and separate two adjacent overlapping electromagnetic wave beams and focus them to separate points on the interior surface or reflective elements of the cavity. In embodiments, the signal focusing devices may be used to compensate any eventual dispersion over the multi-wavelength electromagnetic wave signal.

Figure 4D:
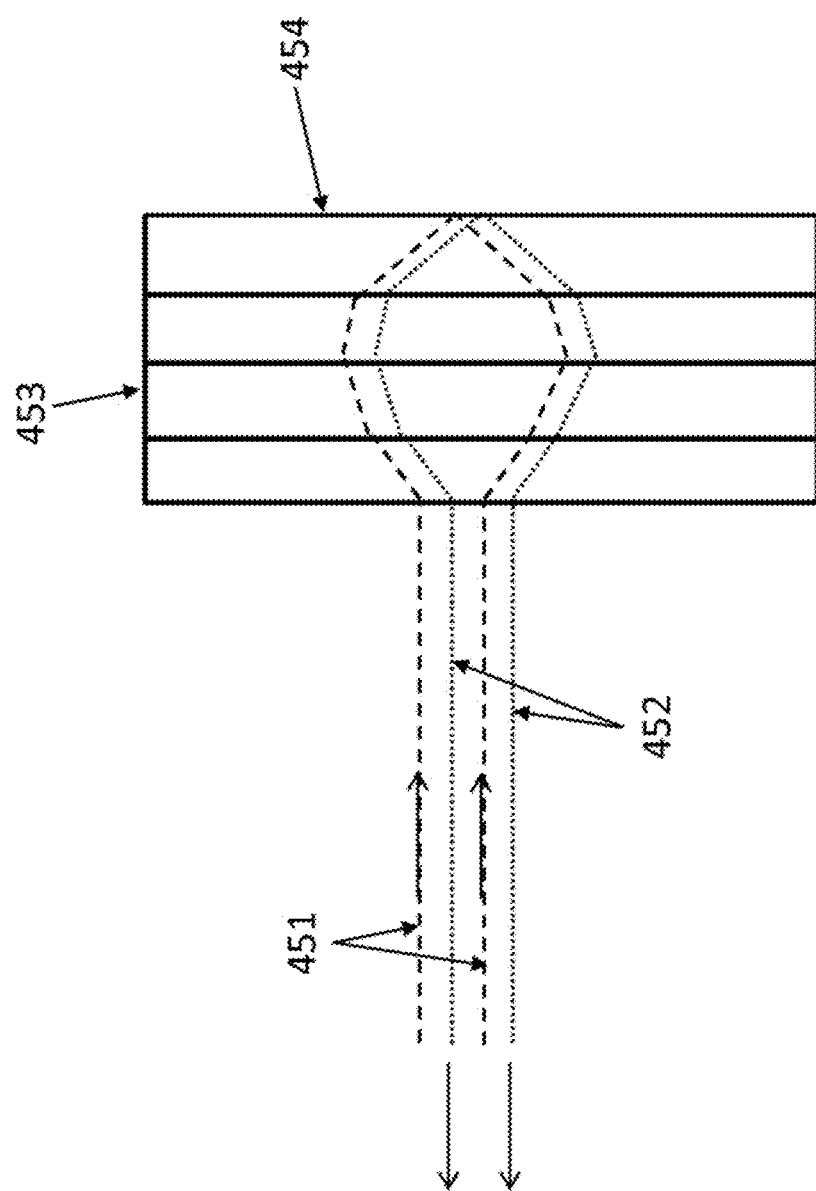
FIG. 4D is a cross-section view of a signal focusing device made of gradient index material, separating two overlapping electromagnetic wave beams in accordance with an exemplary embodiment of the present invention.

For example, the signal focusing device may comprise one or more layers of gradient index (GRIN) materials. FIG. 4D shows how the signal focusing device 453 made of multiple layers of GRIN materials distinguish and separate overlapping incoming electromagnetic wave beam 451 and outgoing electromagnetic wave beam 452 and focus them to separate points on the interior surface 454 of the cavity in accordance with an exemplary embodiment.

FIG. 4E is a cross-sectional view of interior surfaces 443 on two opposing sides of the cubic cavity 101 with signal focusing devices 442 placed either thereon or adjacent thereto in accordance with an exemplary embodiment. FIG. 4E shows that the electromagnetic wave beam 441 is redirected at every bounce from the interior surface 443 and the signal focusing device 442. In this example, the signal focusing devices 442 are configured to distinguish two overlapping electromagnetic wave beams and focus them on different locations on the interior surfaces 443.

Figure 4F:
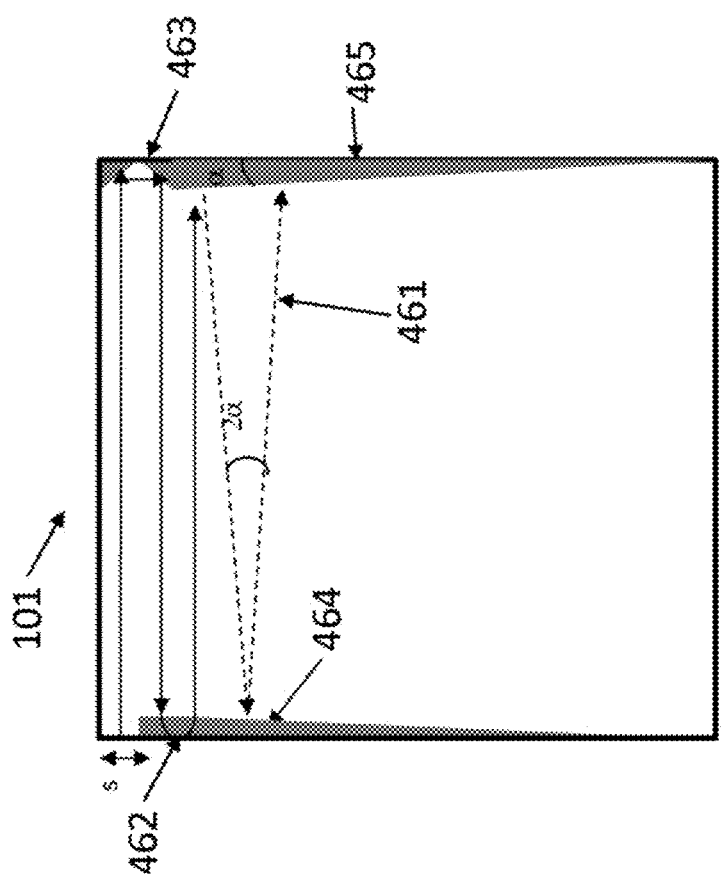
FIG. 4F is a cross-sectional view of interior surfaces of two opposing sides of the cubic cavity of FIG. 1, illustrating an electromagnetic wave beam traversing between the interior surfaces in accordance with an exemplary embodiment of the present invention.

In embodiments, the signal focusing devices can be replaced by or used in combination with other optical elements, such as a special geometry of mirrors configured to focus the beam on either side of the cavity, and/or photonic crystal structures like holes in the signal focusing devices, and/or diffraction structures to achieve a desired optical effect. For example, the Gaussian electromagnetic wave beams may be partially superimposed during flight in the cavity as long as they become distinct at the recovery point. To separate those electromagnetic wave beams at the input/output at, for example, transmitter, receiver, or transceiver, a combination of mirrors at different angles and/or signal focusing devices could be used. FIG. 4F is a cross-sectional view of the cubic cavity 101 in accordance with another exemplary embodiment. On one side of the cubic cavity 101, a combination of a signal focusing device 462 and a continuous mirror plate 464 tilted at an angle is placed, while on the opposite side of the cavity 101, a combination of mirrors 463, 465 tilted at different angles is placed. This exemplary embodiment is configured to discretize an overlapping electromagnetic wave beam 461 to a distinct electromagnetic wave beam at the transceiver.

Figure 4G:
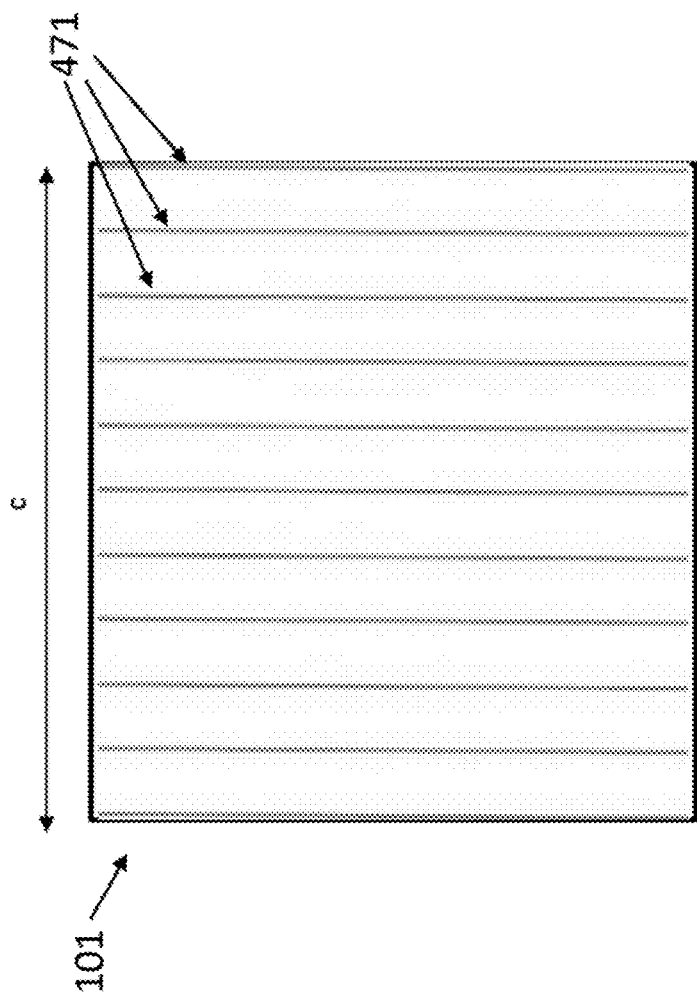
FIG. 4G is a cross-section view of a cavity containing a plurality of parallel plates in accordance with an exemplary embodiment of the present invention.

To increase the data storage capacity of a cavity, such as a cubic cavity, a plurality of parallel plates may be placed within the inside of the cavity. Each side of each of the plates may comprise, in part or in full, a reflective surface or a surface having a reflective element disposed thereon. Each of the reflective surfaces and reflective elements may comprise any kind of reflective elements or materials, such as mirrors, reflective coatings, to name a few, or gratings, or any other photonic microstructure materials configured to reflect, regenerate, separate, and/or process the incident electromagnetic wave signal. In embodiments, these parallel plates 471 may be positioned substantially equidistant from each other within the inside of a cubic cavity 101, as shown in FIG. 4G. These plates may be positioned along any of the three perpendicular directions that are parallel to a cube face.

In embodiments, a second set of parallel plates may be further added in the cavity along one of the other two perpendicular directions that are parallel to a cube face. The second set of parallel plates may be placed substantially equidistant from each other. In embodiments, a third set of parallel plates may be further added in the cavity, wherein the third set of parallel plates are perpendicular to the first and second sets of parallel plates. The third set of parallel plates may be placed substantially equidistant from each other. Each side of each of the second and third sets of parallel plates may comprise, in part or in full, a reflective surface or a surface having a reflective element disposed thereon. Each of the reflective surfaces and reflective elements may comprise any kind of reflective elements or materials, such as mirrors, reflective coatings, to name a few, or gratings, or any other photonic microstructure materials configured to reflect, regenerate, separate, and/or process the incident electromagnetic wave signal. The first, second and third sets of parallel plates may together define a plurality of sub-cavities. Some or all of these sub-cavities may be configured to contain an electromagnetic wave signal.

Assuming that a set of multiple parallel plates fits in the entire cubic cavity 101 and are arrayed equidistantly between the two opposing sides of the cubic cavity having a side length of c, as shown in FIG. 4G, the distance between two parallel plates 471 is c/N for (N+1) plates in the cavity. In this case, the size of electromagnetic wave beams is reduced, because the Rayleigh range is shorter. In the direction perpendicular to the plates, the optimized transverse beam size for Gaussian beams would be changed to $s=3\sqrt{(\lambda c/N\pi)}$. Although the volume of each compartment between two parallel plates 471 is reduced to $c^3/N$, the optical path in a compartment in the direction perpendicular to the plates remains unchanged and equal to $L=4c^2\pi/(9\lambda)$. When the two other directions of propagation are added, the total optical path length is increased from $L=4c^2/(3\lambda)$ to $L=4(2+N)c^2\pi/(9\pi)$. Hence, the exemplary embodiment using (N+1) parallel plates arrayed in one direction may increase the data storage capacity of the cubic cavity by a factor of $(2+N)/3$.

By adding parallel plates in the other two perpendicular directions in each compartment, and following similar reasoning, one can show that the data storage capacity would increase by a factor of $(1+2N)/3$ if (N+1) parallel plates are added in one other direction, and by a factor of N if (N+1) parallel plates are added in each of all three perpendicular directions. When (N+1) parallel plates are added in each of all three perpendicular directions, forming $N^3$ sub-cavities within the cavity 101, the total data storage capacity of the cubic cavity would increase by a factor of N.

Referring now to FIGS. 7A and 7B, there are depicted exemplary embodiments in the form of apparatuses for storing electromagnetic wave signals, such as data in motion, using rectangular shaped cavities 701 and 702, each with length l, height h and width w. Like the exemplary embodiment of cubic cavity shown in, for example, FIGS. 1 and 4A, preferably all directions and interior surfaces of the rectangular shaped cavity 701, 702 are configured to maximize the data storage capacity. Based on the analogous reasoning discussed above in connection with the cubic cavity 101 where h=l=w, the optical path length in the rectangular shaped cavity 701, 702 may be given by $L=12 hlw/s^2$, where s is the diameter of an electromagnetic wave beam spot bouncing off the cavity walls.

To minimize the number of bounces, one may choose to propagate the electromagnetic wave beam (e.g., laser beam) only in the direction parallel to, for example, the length l of the rectangular shaped cavity. In this example, the optical path length would be reduced by a factor of 3 and the number of bounces would decrease from $4 hw/s^2+4 lw/s^2+4 hl/s^2$ to $4 hw/s^2$, which can be significant when the length l of the rectangular shaped cavity 701 is large compared to its width w and height h, as shown in FIG. 7A. Reduction in the number of bounces can reduce the absorption of the electromagnetic wave beam energy from the mirrors in the interior surfaces of the cavity if their reflectivity is less than 1. As a result, there is a reduced need for regenerators and a reduced amount of consumed power.

FIG. 7B shows a rectangular shaped cavity 702 where its length l is short compared to its width w and height h. Such a short rectangular shaped cavity 702 of FIG. 7B still has the same storage time for the electromagnetic wave signal traveling within the cavity as the longer rectangular shaped cavity 701 of FIG. 7A.

In embodiments, like the exemplary embodiments of the cubic cavity described above in connection with, for example, FIGS. 4D-4F, signal focusing devices of different optical materials with different refractive indexes, such as GRIN materials, as well as gratings, lenses, photonic structures, diffraction structures, metamaterials and/or special geometry of mirrors may be used in a rectangular shaped cavity 701, 702 to separate the overlapping electromagnetic wave beams, or refocus the electromagnetic wave beam on the cavity walls. In embodiments, like the exemplary embodiments of the cubic cavity discussed above in connection with FIG. 4G, a plurality of parallel plates can be placed within the rectangular shaped cavity 701, 702 in one or more of the three perpendicular directions to increase the data storage capacity.

In embodiments, regenerators may be placed along the optical path within the rectangular shaped cavity 701, 702 and used to restore the electromagnetic wave signal to its original state and/or compensate for any degradation.

In embodiments, an optical apparatus may be used to refocus or reshape the electromagnetic wave beam traveling within the rectangular shaped cavity 701, 702. Such optical apparatus may comprise a combination of lenses, gratings, metamaterials, or optical materials or elements configured to modify the wave-fronts of the electromagnetic wave beam.

In accordance with another exemplary embodiment, an apparatus for storing electromagnetic wave signals, such as data in motion, may use a tube cavity. For example, an electromagnetic wave beam, which can be collimated or diffracting, may be injected into the tube cavity at any angle. The tube cavity may comprise internal mirrors and/or other optical elements configured to redirect the electromagnetic wave beam. Depending on the angle of the incident electromagnetic wave beam and the internal optical elements for redirecting the electromagnetic wave beam, an optical path of arbitrary length may be constructed.

FIG. 8 is a cross-sectional view of the base 802 of a tube cavity 801. The tube cavity 801 has a length l and its base has a diameter d. For example, if the electromagnetic wave beam travels in parallel with the tube length and one considers only the parts covered by a square 803 that fits in the base disc 802, then the optical path length for the tube cavity 801 can be estimated to be $L=4 \, ld^2/(2s^2)$. If the parts not covered by the square 803 are used, then even more data storage capacity may be achieved.

In embodiments, like the exemplary embodiments based on a cubic cavity and a rectangular shaped cavity described above, signal focusing devices of different optical materials with different refractive indexes, such as GRIN materials, as well as gratings, lenses, metamaterials, and/or special geometry of mirrors may be used in a tube cavity 801 to separate the overlapping electromagnetic wave beams, or refocus the electromagnetic wave beam on the cavity walls.

In embodiments, regenerators may be placed along the optical path within the tube cavity 801 and used to restore the electromagnetic wave signal to its original state and/or compensate for any degradation.

In embodiments, an optical apparatus may be used to refocus or reshape the electromagnetic wave beam traveling within the tube cavity 801. Such optical apparatus may comprise a combination of lenses, gratings, metamaterials, or optical materials or elements configured to modify the wave-fronts of the electromagnetic wave beam.

In accordance with yet another exemplary embodiment, an apparatus for storing electromagnetic wave signals, such as data in motion, may use an egg-shaped cavity. In embodiments, an electromagnetic wave beam carrying data in motion may enter the egg-shaped cavity at any angle. Depending on the angle of entry, the electromagnetic wave beam may travel a path of desired optical length within the egg-shaped cavity.

FIG. 9 is a cross-section view of an egg-shaped cavity 901 having ellipsoidal curved reflective interior surface 162 in accordance with an exemplary embodiment. In this embodiment, the input/output coupler (e.g., OPU) may be a partially transmissive portion 161 of the reflective surface 162 which allows an input beam 163 into the cavity and couples an appropriate fraction of the power in the cavity out each round trip as the output beam 164. To provide signal erasing and signal regeneration, an eraser 103 and a gain medium 153 may be provided within the cavity in the path of the signal beam. In addition, a nonlinear filter and/or multiplexing elements may also be provided in the cavity system.

In embodiments, signal focusing devices of different optical materials with different refractive indexes, such as GRIN materials, as well as gratings, lenses, metamaterials, and/or special geometry of mirrors may be used in the egg-shaped cavity 901 to separate the overlapping electromagnetic wave beams, or refocus the electromagnetic wave beam on the cavity walls.

In embodiments, regenerators may be placed along the optical path within the egg-shaped cavity 901 and used to restore the electromagnetic wave signal to its original state and/or compensate for any degradation.

In embodiments, an optical apparatus may be used to refocus or reshape the electromagnetic wave beam traveling within the egg-shaped cavity 901. Such optical apparatus may comprise a combination of lenses, gratings, metamaterials, or optical materials or elements configured to modify the wave-fronts of the electromagnetic wave beam.

In accordance with another exemplary embodiment, an apparatus for storing electromagnetic wave signals, such as data in motion, may use a resonating cavity, which is configured to create resonance at one or more frequencies of the electromagnetic wave signal. The resonating cavity may be of any size and shape as long as it is configured to create resonance at one or more frequencies of the electromagnetic wave signal. For example, cubic cavity, rectangular shaped cavity, tube cavity and egg-shaped cavity may each be made resonating by aligning precisely the frequencies of the electromagnetic wave signal with a multiple of the inverse of the round trip of the cavity. Within such a resonating cavity, all electromagnetic wave signal frequencies constructively interfere while any spurious frequencies would be diminished by destructive interference. Storage of data in motion in a resonating cavity may be useful in the case where amplifiers are used to compensate for loss.

While this invention has been described in conjunction with exemplary embodiments outlined above and illustrated in the drawings, it is evident that the principles of the present invention may be implemented using any number of techniques, whether currently known or not, and many alternatives, modifications and variations in form and detail will be apparent to those skilled in the art. Modifications, additions, or omissions may be made to the systems, apparatuses, and methods described herein without departing from the scope of the present invention. For example, the components of the systems and apparatuses may be integrated or separated. Furthermore, the operations of the systems and apparatuses disclosed herein may be performed by more, fewer, or other components and the methods described may include more, fewer, or other steps. Additionally, steps may be performed in any suitable order.

As defined herein, electromagnetic waves include acoustic waves. Accordingly, storage in motion of information or any kind of data can also be implemented using acoustic (i.e., sound) waves. Representative values for the speed of sound include about 1,500 m/sec in water, about 330 m/sec in air, and about 6,000 m/sec in steel. (There are a range of velocities for each case.) In terms of frequency, sound waves can be in the region of tens of MHz. For example, some medical ultrasound devices operate in the regions of tens of MHz. Usually, lower frequency sound also has less attenuation over distance.

A benefit of using acoustic waves for storage in motion is the relatively slower speed of sound. In this regard, if the wave signal carrying information or any kind of data in motion is an acoustic wave, the much lower speed of sound (as compared to the speed of light) enables one to store a greater amount of data in motion in a cavity without requiring a higher data rate at which the data is introduced into the cavity.

Acoustic waves require some medium in order to propagate. Information or any kind of data can be transmitted and/or reflected between structures or within structures using acoustic waves in various transmission media (e.g., air and steel, to name a few). Embodiments of storage in motion using acoustic waves could be constructed using such media. For steel, railroad tracks could be a long-distance medium. Acoustic waves can be generated using various sources of vibration, including crystal transducers and speakers, to name a few. Microphones detect acoustic waves. There is a significant base of acoustic technology in sound systems, in systems to eliminate vibration, and in systems to measure vibration. This device technology can be utilized in developing storage in motion systems using acoustic waves in accordance with the principles employed in the embodiments disclosed in the present application.

Accordingly, the exemplary embodiments of the invention, as set forth above, are intended to be illustrative, not limiting, and the spirit and scope of the present invention is to be construed broadly and limited only by the appended claims, and not by the foregoing specification.

In addition, unless otherwise specifically noted, articles depicted in the drawings are not necessarily drawn to scale.

What is claimed is:

1. An apparatus comprising:
   a cavity comprising interior surfaces or reflecting elements, wherein the cavity is partially or fully enclosed;
   one or more transmitters configured to receive an electrical signal, transform the electrical signal into an electromagnetic wave signal, and introduce the electromagnetic wave signal into an inside of the cavity; and
   one or more receivers configured to retrieve the electromagnetic wave signal, transform the electromagnetic wave signal to a corresponding electrical signal, and transmit the corresponding electrical signal to the outside of the cavity,
   wherein the electromagnetic wave signal is contained within the inside of the cavity by undergoing a series of reflections or traversals between the interior surfaces or the reflecting elements of the cavity.

2. The apparatus of claim 1, further comprising:
   one or more regenerators configured to re-amplify, re-shape, or re-time the electromagnetic wave signal traveling within the inside of the cavity.

3. The apparatus of claim 2, wherein the one or more regenerators comprise crystals or optical fibers.

4. The apparatus of claim 3, wherein the crystals or the optical fibers are doped.

5. The apparatus of claim 4, wherein the crystals or optical fibers are doped by fluorescent elements.

6. The apparatus of claim 2, wherein the one or more regenerators comprise at least one amplifier and at least one absorber.

7. The apparatus of claim 2, wherein the one or more regenerators comprise at least one amplifier configured to operate in a saturation regime.

8. The apparatus of claim 2, wherein the one or more regenerators comprise a nonlinear filter.

9. The apparatus of claim 2, wherein the one or more regenerators comprise an all-optical regenerator or an optoelectronic regenerator.

10. The apparatus of claim 1, further comprising:
    a vacuum pump configured to maintain the inside of the cavity substantially under a vacuum condition.

11. The apparatus of claim 1, wherein the electromagnetic wave signal comprises a modulated laser beam.

12. The apparatus of claim 1, wherein the electromagnetic wave signal comprises a Gaussian beam.

13. The apparatus of claim 1, wherein the electromagnetic wave signal comprises a spatial mode.

14. The apparatus of claim 1, wherein the cavity is substantially sealed.

15. The apparatus of claim 1, wherein the cavity comprises a cubic cavity, a rectangular-cavity, a tube cavity, a torus-shaped cavity, a spherical cavity, a polyhedron cavity, a parallelogram-shaped cavity, a prism-shaped cavity, or an egg-shaped cavity.

16. The apparatus of claim 1, wherein the cavity comprises a resonating cavity configured to create resonance at one or more frequencies of the electromagnetic wave signal.

17. The apparatus of claim 1, wherein the one or more transmitters comprise at least one laser and at least one modulator.

18. The apparatus of claim 1, wherein the one or more transmitters comprise at least one directly modulated laser.

19. The apparatus of claim 1, wherein the one or more receivers comprise at least one photodetector.

20. The apparatus of claim 1, wherein at least one of the one or more transmitters and at least one of the one or more receivers are placed together in a transceiver.

21. The apparatus of claim 1, wherein at least one of the one or more transmitters or the one or more receivers is located inside the cavity.

22. The apparatus of claim 1, wherein the interior surfaces of the cavity are made at least in part of mirrors, reflecting coatings, gratings, or photonic microstructure materials configured to reflect or regenerate or separate or process the incident electromagnetic wave signal.

23. The apparatus of claim 1, further comprising at least one of lenses, gratings, metamaterials, and optical materials configured to refocus or reshape the electromagnetic wave signal traveling within the inside of the cavity.

24. The apparatus of claim 1, wherein the reflecting elements comprise a plurality of first parallel plates positioned within the inside of the cavity, wherein at least a portion of each side of each one of the first parallel plates comprises a reflective surface or a surface with a reflective element disposed thereon.

25. The apparatus of claim 24, wherein the first parallel plates are positioned substantially equidistant from each other.

26. The apparatus of claim 24, wherein the reflecting elements further comprise a plurality of second parallel plates positioned perpendicular to the first parallel plates and a plurality of third parallel plates positioned perpendicular to the first and second parallel plates such that the first, second and third parallel plates define a plurality of sub-cavities within the inside of the cavity, wherein at least a portion of each side of each one of the second and third parallel plates comprises a reflective surface or a surface with a reflective element disposed thereon and the electromagnetic wave signal is contained within an inside of at least one of the sub-cavities until retrieved.

27. The apparatus of claim 26, wherein the second parallel plates are positioned substantially equidistant from each other.

28. The apparatus of claim 27, wherein the third parallel plates are positioned substantially equidistant from each other.

29. The apparatus of claim 1, further comprising a signal focusing device placed on, or adjacent to, one or more of the interior surfaces or reflecting elements of the cavity and configured to separate two adjacent overlapping electromagnetic wave beams and focus them to separate points on the reflective interior surfaces or reflecting elements.

30. The apparatus of claim 29, wherein the signal focusing device comprises a gradient index material, a photonic crystal structure, a mirror structure, or a diffraction structure.

31. The apparatus of claim 1, wherein:
the cavity comprises a cubic cavity; and
portions of the interior surfaces for two opposing faces of the cubic cavity comprise mirrors configured to reflect the incident electromagnetic wave signal such that the electromagnetic wave signal travels in a zig-zag manner within a first plane substantially perpendicular to the two opposing faces of the cubic cavity.

32. The apparatus of claim 31, wherein each of the mirrors is configured to reflect the incident electromagnetic wave signal by an angle $\alpha = \sin^{-1}(s/(2\sqrt{(c^2+s^2)}))$, wherein c is a side length of the cubic cavity and s is a transversal spot size of the electromagnetic wave signal.

33. The apparatus of claim 31, further comprising a signal directing element configured to direct the electromagnetic wave signal to travel within a second plane, which is substantially parallel and adjacent to the first plane.

34. The apparatus of claim 31, further comprising a signal directing element configured to direct the electromagnetic wave signal to travel within a second plane, which is substantially perpendicular to the first plane.

35. A method using an electromagnetic wave storage device comprising a partially or fully enclosed cavity having interior surfaces or reflecting elements, one or more transmitters and one or more receivers, the method comprising the steps of:
receiving, by the one or more transmitters, an electrical signal;
transforming, by the one or more transmitters, the received electrical signal into an electromagnetic wave signal;
introducing, by the one or more transmitters, the electromagnetic wave signal into an inside of the cavity, wherein the electromagnetic wave signal is contained within the inside of the cavity by undergoing a series of reflections or traversals between the interior surfaces or the reflecting elements of the cavity;
retrieving, by the one or more receivers, the electromagnetic wave signal;
transforming, by the one or more receivers, the retrieved electromagnetic wave signal to a corresponding electrical signal; and
transmitting, from the one or more receivers, the corresponding electrical signal to the outside of the cavity.

36. The method of claim 35, wherein the electromagnetic wave storage device further comprises one or more regenerators, and the method further comprises re-amplifying, re-shaping, or re-timing, by the one or more regenerators, the electromagnetic wave signal traveling within the inside of the cavity.

37. The method of claim 36, wherein the one or more regenerators comprise an all-optical regenerator and the step of re-amplifying, re-shaping, or re-timing the electromagnetic wave signal is performed by the all-optical regenerator in an optical domain.

38. The method of claim 36, wherein:
the one or more regenerators comprise an optoelectronic regenerator, and
the step of re-amplifying, re-shaping, or re-timing the electromagnetic wave signal comprises the steps of:
converting, by the optoelectronic regenerator, the electromagnetic wave signal to a corresponding electrical signal;
re-amplifying, re-shaping, or re-timing, by the optoelectronic regenerator, the corresponding electrical signal electrically; and
converting, by the optoelectronic regenerator, the regenerated electrical signal to a corresponding electromagnetic wave signal in an optical domain.

39. The method of claim 35, wherein the electromagnetic wave storage device further comprises maintaining the inside of the cavity substantially under a vacuum condition.

40. The method of claim 35, wherein the step of transforming, by the one or more transmitters, the received electrical signal into the electromagnetic wave signal comprises transforming, by the one or more transmitters, the received electrical signal into a modulated laser beam.

41. The method of claim 35, wherein the step of transforming, by the one or more transmitters, the received electrical signal into the electromagnetic wave signal comprises transforming, by the one or more transmitters, the received electrical signal into a Gaussian beam.

42. The method of claim 35, wherein the step of transforming, by the one or more transmitters, the received electrical signal into the electromagnetic wave signal comprises transforming, by the one or more transmitters, the received electrical signal into a spatial mode.

43. The method of claim 35, further comprising refocusing or reshaping, by using at least one of lenses, gratings, metamaterials, and optical materials, the electromagnetic wave signal traveling within the inside of the cavity.

44. The method of claim 35, wherein the electromagnetic wave storage device further comprises a signal focusing device, which is placed on, or adjacent to, one or more of the interior surfaces or reflecting elements of the cavity and configured to separate two adjacent overlapping electromagnetic wave beams and focus them to separate points on the reflective interior surfaces or reflecting elements, the method further comprises the steps of:
focusing, by using the signal focusing device, the incident electromagnetic wave signal; and
redirecting, by using the signal focusing device, the electromagnetic wave signal to an opposite direction.

45. The method of claim 44, wherein the signal focusing device comprises a gradient index material, a photonic crystal structure, a mirror structure, or a diffraction structure.

46. The method of claim 35, wherein:
the cavity comprises a cubic cavity and portions of the interior surfaces for two opposing faces of the cubic cavity comprise mirrors, and
the method further comprises reflecting, by the mirrors, the incident electromagnetic wave signal such that the electromagnetic wave signal travels in a zig-zag manner within a first plane substantially perpendicular to the two opposing faces of the cubic cavity.

47. The method of claim 46, wherein the step of reflecting, by the mirrors, the incident electromagnetic wave signal comprises reflecting, by each of the mirrors, the incident electromagnetic wave signal by an angle $\alpha = \sin^{-1}(s/(2\sqrt{(c^2+s^2)}))$, wherein c is a side length of the cubic cavity and s is a transversal spot size of the electromagnetic wave signal.

48. The method of claim 46, wherein the electromagnetic wave storage device further comprises a signal directing element, and the method further comprises directing, by the signal directing element, the electromagnetic wave signal to travel within a second plane, which is substantially parallel and adjacent to the first plane.

49. The method of claim 46, wherein the electromagnetic wave storage device further comprises a signal directing element, and the method further comprises directing, by the signal directing element, the electromagnetic wave signal to travel within a second plane, which is substantially perpendicular to the first plane.

50. The method of claim 35, wherein at least one of the transmitting step or the retrieving step is performed inside the cavity.

* * * * *